US010502807B2

(12) United States Patent
Steuer

(10) Patent No.: US 10,502,807 B2
(45) Date of Patent: Dec. 10, 2019

(54) CALIBRATION SYSTEM FOR VOLTAGE MEASUREMENT DEVICES

(71) Applicant: Fluke Corporation, Everett, WA (US)

(72) Inventor: Ronald Steuer, Hinterbruhl (AT)

(73) Assignee: Fluke Corporation, Everett, WA (US)

( * ) Notice: Subject to any disclaimer, the term of this patent is extended or adjusted under 35 U.S.C. 154(b) by 276 days.

(21) Appl. No.: 15/695,542

(22) Filed: Sep. 5, 2017

(65) Prior Publication Data

US 2019/0072633 A1 Mar. 7, 2019

(51) Int. Cl.
*G01R 35/00* (2006.01)
*G01R 1/22* (2006.01)
(Continued)

(52) U.S. Cl.
CPC ......... *G01R 35/007* (2013.01); *G01D 18/008* (2013.01); *G01R 1/22* (2013.01);
(Continued)

(58) Field of Classification Search
CPC ............... G01R 35/007; G01R 15/144; G01R 19/2503; G01R 31/3191; G01R 19/16561; G01R 19/0084; G01R 15/125; G01R 19/25; G01R 15/16; G01R 1/22; G01R 19/00; G01R 15/207; G01R 15/14; G01D 18/008
See application file for complete search history.

(56) References Cited

U.S. PATENT DOCUMENTS 5,473,244 A 12/1995 Libove et al.
5,583,444 A 12/1996 Nakamura et al.
(Continued)

FOREIGN PATENT DOCUMENTS

DE 20 2017 003 539 U1 9/2017
EP 1 249 706 B1 9/2007
(Continued)

OTHER PUBLICATIONS

Sensor Calibration with TEDS Technology, National Instruments, 2006 (Year: 2006).*
(Continued)

*Primary Examiner* — Daniel R Miller
(74) *Attorney, Agent, or Firm* — Seed Intellectual Property Law Group LLP

(57) ABSTRACT

Systems and methods for calibrating a voltage measurement device are provided herein. The voltage measurement device generates a reference current signal and senses the reference current signal in a conductor under test. A calibration system may control a calibration voltage source to selectively output calibration voltages in a calibration conductor. The calibration system may obtain data from the voltage measurement device captured by the voltage measurement device when measuring the calibration conductor. Such data may include one or more reference current measurements, one or more voltage measurements, etc. The calibration system utilizes the obtained measurements to generate calibration data which may be stored on the voltage measurement device for use thereby during subsequent operation. The calibration data may include one or more lookup tables, coefficients for one or more mathematical formulas, etc.

22 Claims, 12 Drawing Sheets

(51) Int. Cl.
*G01R 15/12* (2006.01)
*G01R 15/14* (2006.01)
*G01R 15/16* (2006.01)
*G01R 15/20* (2006.01)
*G01R 19/00* (2006.01)
*G01R 19/25* (2006.01)
*G01D 18/00* (2006.01)
*G01R 19/165* (2006.01)
*G01R 31/319* (2006.01)

(52) U.S. Cl.
CPC ........... *G01R 15/125* (2013.01); *G01R 15/14* (2013.01); *G01R 15/144* (2013.01); *G01R 15/16* (2013.01); *G01R 15/207* (2013.01); *G01R 19/00* (2013.01); *G01R 19/0084* (2013.01); *G01R 19/16561* (2013.01); *G01R 19/25* (2013.01); *G01R 19/2503* (2013.01); *G01R 31/3191* (2013.01)

(56) References Cited

U.S. PATENT DOCUMENTS

| | | | |
|---|---|---|---|
| 5,973,501 | A | 10/1999 | Reichard |
| 6,014,027 | A | 1/2000 | Reichard |
| 6,043,640 | A | 3/2000 | Lauby et al. |
| 6,118,270 | A | 9/2000 | Singer et al. |
| 6,664,708 | B2 | 12/2003 | Schlimak et al. |
| 6,812,685 | B2 | 11/2004 | Steber et al. |
| 6,825,649 | B2 | 11/2004 | Nakano |
| 7,084,643 | B2 | 8/2006 | Howard et al. |
| 7,466,145 | B2 | 12/2008 | Yanagisawa |
| 8,054,061 | B2 | 11/2011 | Prance et al. |
| 8,222,886 | B2 | 7/2012 | Yanagisawa |
| 8,680,845 | B2 | 3/2014 | Carpenter et al. |
| 8,803,506 | B2 | 8/2014 | Yanagisawa |
| 9,063,184 | B2 | 6/2015 | Carpenter et al. |
| 9,201,100 | B2 | 12/2015 | Yanagisawa |
| 2002/0167303 | A1 | 11/2002 | Nakano |
| 2008/0116880 | A1 | 5/2008 | McEachern et al. |
| 2010/0090682 | A1 | 4/2010 | Armstrong |
| 2010/0283539 | A1 | 11/2010 | Yanagisawa |
| 2012/0200291 | A1 | 8/2012 | Carpenter et al. |
| 2012/0319675 | A1* | 12/2012 | El-Essawy ............ G01R 35/02 324/74 |
| 2013/0076343 | A1 | 3/2013 | Carpenter et al. |
| 2013/0124136 | A1 | 5/2013 | Neeley et al. |
| 2015/0061636 | A1 | 3/2015 | Tsai et al. |
| 2015/0168464 | A1 | 6/2015 | Yogeeswaran et al. |
| 2015/0331079 | A1 | 11/2015 | Kolwalkar et al. |
| 2016/0080667 | A1 | 3/2016 | Stuart et al. |
| 2016/0109486 | A1 | 4/2016 | Yanagisawa |
| 2016/0119592 | A1 | 4/2016 | Stuart et al. |
| 2016/0187449 | A1 | 6/2016 | Beiner et al. |
| 2017/0123036 | A1 | 5/2017 | Miyake |

FOREIGN PATENT DOCUMENTS

| | | | |
|---|---|---|---|
| JP | 63238466 | A * | 10/1988 |
| JP | 2006-242855 | A | 9/2006 |
| JP | 2007-163414 | A | 6/2007 |
| JP | 2007-163415 | A | 6/2007 |
| JP | 2007-212204 | A | 8/2007 |
| JP | 2007-256141 | A | 10/2007 |
| JP | 2008-2925 | A | 1/2008 |
| JP | 2008-14644 | A | 1/2008 |
| JP | 2008-14645 | A | 1/2008 |
| JP | 2008-20270 | A | 1/2008 |
| JP | 2008-261646 | A | 10/2008 |
| JP | 2008-261783 | A | 10/2008 |
| JP | 2008-261785 | A | 10/2008 |
| JP | 2009-168696 | A | 7/2009 |
| JP | 2010-25778 | A | 2/2010 |
| JP | 2010-286347 | A | 12/2010 |
| JP | 2011-122860 | A | 6/2011 |
| JP | 2012-47677 | A | 3/2012 |
| JP | 2014-44168 | A | 3/2014 |
| JP | 2014-44169 | A | 3/2014 |
| JP | 2016-3997 | A | 1/2016 |

OTHER PUBLICATIONS

How to calibrate a thermocouple, Fluke, 2015 (Year: 2015).*
Hioki, "3258 : Safety HiTESTER," Revised Edition 5, Hioki E. E. Corporation, Nagano Japan, 2 pages.
Huber et al., "Non-Contact Voltage Measurement Systems," U.S. Appl. No. 62/421,124, filed Nov. 11, 2016, 122 pages.
Mitchell Instrument Company Inc., clipping from the Mitchell Catalogue, undated, 1 page.
Neeley et al., "Maintenance Management Systems and Methods," U.S. Appl. No. 61/514,842, filed Aug. 3, 2011, 22 pages.
Ringsrud et al., "Non-Contact Voltage Measurement System," U.S. Appl. No. 15/345,256, filed Nov. 7, 2016, 39 pages.
Rodriguez et al., "Non-Contact Current Measurement System," U.S. Appl. No. 15/604,320, filed May 24, 2017, 66 pages.
Steuer et al., "Non-Contact Electrical Parameter Measurement Systems," U.S. Appl. No. 15/625,745, filed Jun. 16, 2017, 130 pages.
Steuer et al., "Non-Contact Voltage Measurement System Using Multiple Capacitors," U.S. Appl. No. 15/412,891, filed Jan. 23, 2017, 35 pages.
Steuer et al., "Non-Contact Voltage Measurement System Using Reference Signal," U.S. Appl. No. 15/413,025, filed Jan. 23, 2017, 49 pages.
Stuart et al., "Combined Use of Digital Multimeter and Infrared Camera to Analyze and Diagnose Issues With Voltage Drop and Impedance," U.S. Appl. No. 62/051,930, filed Sep. 17, 2014, 3 pages.
Stuart et al., "Imaging System Employing Fixed, Modular Mobile, and Portable Infrared Cameras With Ability to Receive, Communicate, and Display Data and Images With Proximity Detection," U.S. Appl. No. 62/068,392, filed Oct. 24, 2014, 9 pages.
Stuart et al., "Infrared Cameras Used as a Method to Trigger Operation and/or Recording of Test and Measurement Devices," U.S. Appl. No. 62/076,088, filed Nov. 6, 2014, 14 pages.
Takahashi, "Clamp on Power Logger PW3365 : Safety Voltage Sensor PW9020," *Hioki Technical Notes* 1(1): 2015, 8 pages.
Tsang et al., "Dual capacitive sensors for non-contact AC voltage measurement," *Sensors and Actuators A* 167:261-266, 2011.
European Search Report dated Jan. 31, 2019, for European Application No. 18180921.1, 8 pages.
Galliana et al., "Traceable Technique to Calibrate Clamp Meters in AC Current From 100 to 1500 A," *IEEE Transactions on Instrumentation and Measurement* 61(9):2512-2518, 2012.
Paulus et al., "Integrated front-end for on line continuous calibration of Rogowski coil current transducer," 21$^{st}$ *IEEE International Conference on Electronics, Circuits and Systems (ICECS)*, Marseille, France, Dec. 7-10, 2014, pp. 391-394.
So et al., "A Computer-Controlled Load Loss Standard for Calibrating High-Voltage Power Measurement Systems," *IEEE Transactions on Instrumentation and Measurement* 44(2):425-428, 1995.

* cited by examiner

| CAL PTS | IR (100V) | CALFAC (100V) | IR IR(250) | CALFAC (250V) | IR (800V) | CALFAC (800V) |
|---|---|---|---|---|---|---|
| 1 | 999998 | 0.9346 | 999998 | 0.9349 | 999998 | 0.9352 |
| 2 | 196921 | 0.9346 | 199236 | 0.9349 | 196692 | 0.9352 |
| 3 | 196994 | 0.9355 | 198837 | 0.9346 | 196679 | 0.9356 |
| 4 | 153923 | 0.9372 | 157069 | 0.9370 | 158545 | 0.9379 |
| 5 | 107328 | 0.9425 | 107755 | 0.9423 | 102494 | 0.9434 |
| 6 | 76282 | 0.9488 | 74837 | 0.9502 | 76412 | 0.9499 |
| 7 | 57600 | 0.9606 | 56702 | 0.9612 | 56455 | 0.9618 |
| 8 | 46726 | 0.9728 | 46031 | 0.9739 | 45684 | 0.9748 |
| 9 | 36084 | 0.9970 | 36032 | 0.9980 | 36161 | 0.9974 |
| 10 | 29703 | 1.0235 | 29738 | 1.0238 | 29528 | 1.0256 |
| 11 | 24631 | 1.0593 | 24848 | 1.0575 | 24356 | 1.0637 |
| 12 | 20994 | 1.1013 | 20694 | 1.1062 | 21154 | 1.1003 |
| 13 | 17860 | 1.1587 | 17780 | 1.1596 | 18038 | 1.1561 |
| 14 | 15383 | 1.2300 | 15338 | 1.2303 | 15315 | 1.2321 |
| 15 | 13634 | 1.3021 | 13518 | 1.3075 | 13531 | 1.3108 |
| 16 | 12005 | 1.4065 | 11917 | 1.4116 | 12028 | 1.4092 |
| 17 | 10821 | 1.5291 | 10818 | 1.5198 | 10808 | 1.5241 |
| 18 | 9875 | 1.6556 | 9770 | 1.6633 | 9844 | 1.6580 |
| 19 | 9047 | 1.8248 | 9029 | 1.8235 | 9007 | 1.8219 |
| 20 | 8453 | 2.0000 | 8400 | 2.0113 | 8413 | 2.0060 |

FIG. 9

CALIBRATION SYSTEM FOR VOLTAGE MEASUREMENT DEVICES

BACKGROUND

Technical Field

The present disclosure generally relates to voltage measurement devices, and more particularly, to calibration systems for voltage measurement devices.

Description of the Related Art

Voltmeters are instruments used for measuring voltage in an electric circuit. Instruments which measure more than one electrical characteristic are referred to as multimeters or digital multimeters (DMMs), and operate to measure a number of parameters generally needed for service, troubleshooting, and maintenance applications. Such parameters typically include alternating current (AC) voltage and current, direct current (DC) voltage and current, and resistance or continuity. Other parameters, such as power characteristics, frequency, capacitance, and temperature, may also be measured to meet the requirements of the particular application.

With conventional voltmeters or multimeters which measure AC voltage, it is necessary to bring at least two measurement electrodes or probes into galvanic contact with a conductor, which often requires cutting away part of the insulation of an insulated electrical wire, or providing a terminal for measurement in advance. Besides requiring an exposed wire or terminal for galvanic contact, the step of touching voltmeter probes to stripped wires or terminals can be relatively dangerous due to the risks of shock or electrocution. A "non-contact" voltage measurement device may be used to detect the presence of alternating current (AC) voltage without requiring galvanic contact with the circuit.

BRIEF SUMMARY

A calibration system operative to calibrate a voltage measurement device, wherein the voltage measurement device, in operation, generates a reference current signal and senses the reference current signal in a conductor under test via a voltage measurement device sensor may be summarized as including a controllable calibration voltage source operative to selectively output a voltage in a calibration conductor; and control circuitry communicatively coupleable to the calibration voltage source and the voltage measurement device, wherein the control circuitry, in operation, for each calibration voltage of a plurality of calibration voltages: controls the calibration voltage source to output the calibration voltage in the calibration conductor; obtains a plurality of calibration points associated with the calibration voltage, each of the calibration points including: a reference current signal data point obtained from the voltage measurement device that is indicative of the reference current signal that is measured by the voltage measurement device via the voltage measurement device sensor when the calibration voltage source outputs the calibration voltage in the calibration conductor; and a calibration factor indicative of a ratio of the calibration voltage to a measured output voltage data point obtained from the voltage measurement device that is determined by the voltage measurement device based at least in part on the reference current signal data point; determines calibration data for the voltage measurement device based on the obtained plurality of calibration points, the calibration data dependent on the reference current signal measured by the voltage measurement device and the plurality of calibration voltages; and stores the calibration data on at least one nontransitory processor-readable storage medium associated with the voltage measurement device for use by the voltage measurement device during subsequent operation of the voltage measurement device.

The voltage measurement device may be a non-contact measurement device, and for each of the plurality of calibration voltages, the calibration points may include a range of reference current signal data points that are obtained by selectively adjusting a physical distance between the voltage measurement device sensor of the voltage measurement device and the calibration conductor. The calibration data may include a lookup table that, in operation, allows the voltage measurement device to determine a calibration factor for a particular reference current signal measurement and a particular output voltage measurement using bilinear interpolation. The calibration data may include coefficients for a plurality of mathematical formulas, wherein each of the plurality of mathematical formulas corresponds to a respective one of the calibration voltages. For each of the calibration voltages, the control circuitry may determine the calibration data by fitting the plurality of calibration points to a curve defined by a mathematical formula. For each of the calibration voltages, the mathematical formula may be $y=a/(x-b)^c+d$, where y is the calibration voltage, x is the reference current signal, and a, b, c, and d are coefficients determined by analysis of the plurality of calibration points associated with the respective calibration voltage. The value of the coefficients a, b, and c for each one of the plurality of mathematical formulas may be equal to the value of the coefficients a, b, and c, respectively, for each of the other ones of the plurality of mathematical formulas. The plurality of calibration voltages may include at least three calibration voltages. The voltage measurement device may include a sensor array including a first sensor portion and a second sensor portion, the first sensor portion interleaved with the second sensor portion, and each of the first and second sensor portions are selectively coupleable to a signal current amplifier and a reference current amplifier via controllable switches. The voltage measurement device may include a sensor array including a plurality of sensor elements, and each of the sensor elements is selectively coupleable to an input node of processing circuitry and to a conductive guard node.

A calibration system operative to calibrate a voltage measurement device, the voltage measurement device including a plurality of voltage measurement device sensors and, in operation, the voltage measurement device generates at least one reference current signal and senses the at least one reference current signal in a conductor under test via the plurality of voltage measurement device sensors may be summarized as including a controllable calibration voltage source operative to selectively output a voltage in a calibration conductor; and control circuitry communicatively coupleable to the calibration voltage source and the voltage measurement device, wherein the control circuitry, in operation: controls the calibration voltage source to output a calibration voltage in the calibration conductor; obtains a plurality of calibration points associated with the calibration voltage, each of the calibration points including: a plurality of reference current signal data points obtained from the voltage measurement device that are indicative of the reference current signals that are measured by the voltage measurement device via the plurality of voltage measurement device sensors when the calibration voltage source outputs the calibration voltage in the calibration conductor; and a calibration factor indicative of a ratio of the calibration voltage to a measured output voltage data point obtained from the voltage measurement device that is determined by the voltage measurement device based at least in part on the plurality of reference current signal data points; determines calibration data for the voltage measurement device based on the obtained plurality of calibration points, the calibration data dependent on the reference current signals measured by the voltage measurement device via the plurality of voltage measurement device sensors; and stores the calibration data on at least one nontransitory processor-readable storage medium associated with the voltage measurement device for use by the voltage measurement device during subsequent operation of the voltage measurement device.

The voltage measurement device may be a non-contact measurement device, and at least some of the calibration points may be obtained by selectively adjusting a physical distance between the voltage measurement device and the calibration conductor. The calibration data may include a lookup table that, in operation, allows the voltage measurement device to determine a calibration factor for a particular plurality of reference current signal measurements using interpolation. The calibration data may include coefficients for at least one mathematical formula. The control circuitry may determine the calibration data by fitting the calibration points to a curve defined by a mathematical formula. The plurality of reference current signal data points for each calibration point may include at least three reference current signal data points.

A method of operating a calibration system to calibrate a voltage measurement device, wherein the voltage measurement device, in operation, generates a reference current signal and senses the reference current signal in a conductor under test via a voltage measurement device sensor may be summarized as including for each calibration voltage of a plurality of calibration voltages, controlling a calibration voltage source to output the calibration voltage in a calibration conductor; obtaining a plurality of calibration points associated with the calibration voltage, each of the calibration points including: a reference current signal data point obtained from the voltage measurement device that is indicative of the reference current signal that is measured by the voltage measurement device via the voltage measurement device sensor when the calibration voltage source outputs the calibration voltage in the calibration conductor; and a calibration factor indicative of a ratio of the calibration voltage to a measured output voltage data point obtained from the voltage measurement device that is determined by the voltage measurement device based at least in part on the reference current signal data point; determining calibration data for the voltage measurement device based on the obtained plurality of calibration points, the calibration data dependent on the reference current signal measured by the voltage measurement device and the plurality of calibration voltages; and storing the calibration data on at least one nontransitory processor-readable storage medium associated with the voltage measurement device for use by the voltage measurement device during subsequent operation of the voltage measurement device.

Determining calibration data may include generating a lookup table that, in operation, allows the voltage measurement device to determine a calibration factor for a particular reference current signal measurement and a particular output voltage measurement using bilinear interpolation. Determining calibration data may include determining coefficients for a plurality of mathematical formulas, each of the plurality of mathematical formulas corresponding to a respective one of the calibration voltages. Determining calibration data includes, for each of the calibration voltages, fitting the calibration points to a curve defined by a mathematical formula.

Controlling the calibration voltage source to output a plurality of calibration voltages may include controlling the calibration voltage source to output at least three calibration voltages. The voltage measurement device may be a non-contact measurement device, and for each of the plurality of calibration voltages, obtaining a plurality of calibration points may include selectively adjusting a physical distance between the voltage measurement device sensor of the voltage measurement device and the calibration conductor.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

FIG. 9 is a lookup table generated by a calibration system, such as the calibration system of FIG. 5, which may be stored on a nontransitory processor-readable storage medium of a voltage measurement device for use thereby to determine the voltage in a conductor under test, according to one illustrated implementation.

DETAILED DESCRIPTION

Figure 1A:
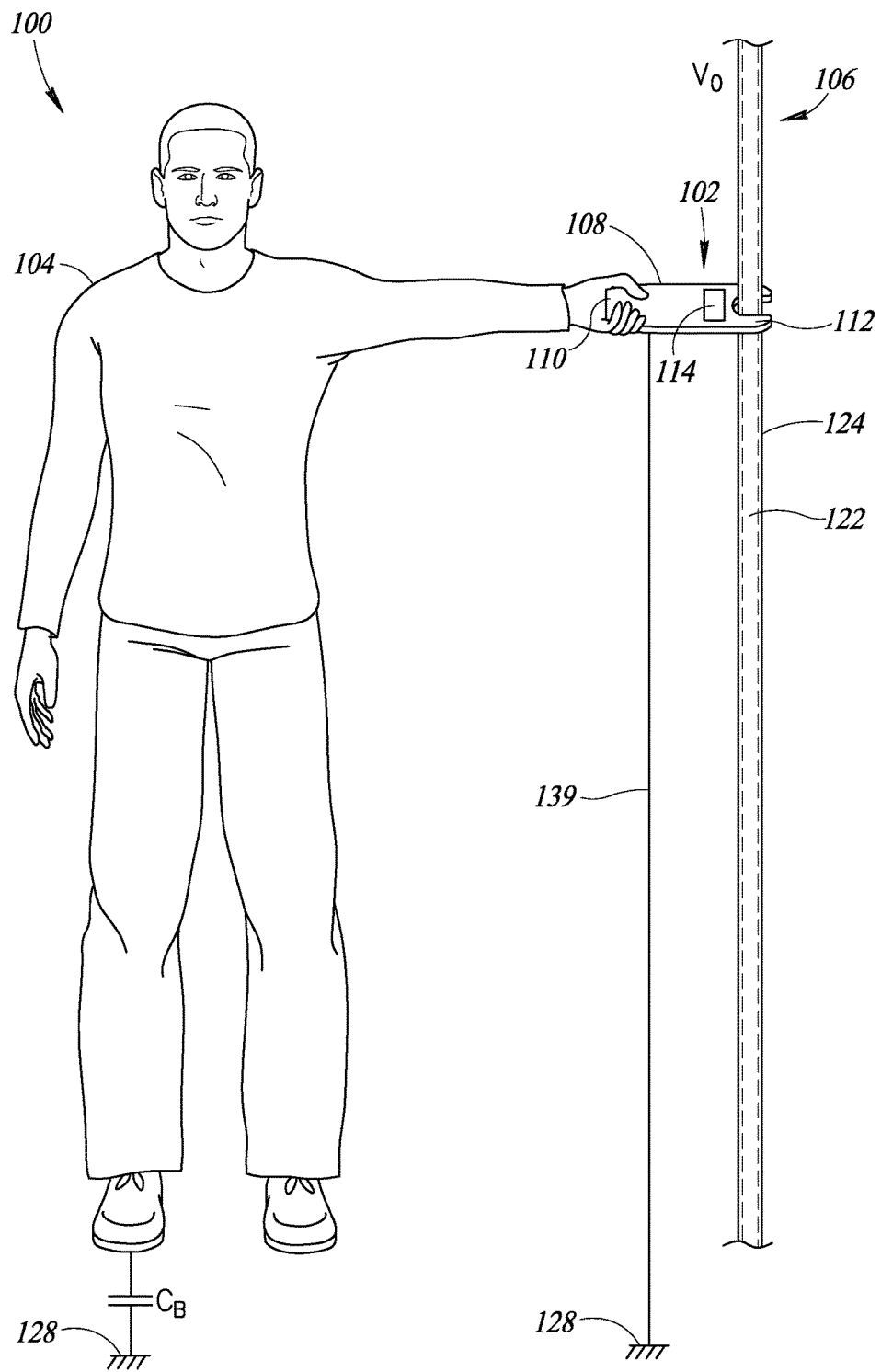
FIG. 1A is a pictorial diagram of an environment in which a non-contact voltage measurement device including a reference signal type voltage sensor may be used by an operator to measure AC voltage present in an insulated wire without requiring galvanic contact with the wire, according to one illustrated implementation.

Systems and methods of the present disclosure advantageously provide for calibration of contact and non-contact "reference signal" type voltage measurement devices. Initially, with reference to FIGS. 1A-4, various examples of reference signal type voltage measurement devices are discussed. Then, with respect to FIGS. 5-12, various calibration systems and associated methods are discussed.

The calibration systems and methods disclosed herein may be used to calibrate non-contact measurement devices in which measurement of one or more alternating current (AC) electrical parameters in an insulated wire is performed without requiring a galvanic connection between the insulated wire and a test electrode or probe. The calibration systems and methods may also be used to calibrate conventional contact type measurement devices that generate and detect reference signals and which utilize conductive test leads or probes in galvanic contact with conductors under test.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Reference Signal Type Non-Contact Voltage Measurement Devices

The following discussion provides examples of systems and methods for measuring alternating current (AC) voltage of an insulated (e.g., insulated wire) or blank uninsulated conductor (e.g., bus bar) without requiring a galvanic connection between the conductor and a test electrode or probe. The implementations disclosed in this section may be referred to herein as "reference signal type voltage sensors" or systems. Generally, a non-galvanic contact (or "non-contact") voltage measurement device is provided which measures an AC voltage signal in an insulated conductor with respect to ground using a capacitive sensor. Such systems which do not require a galvanic connection are referred to herein as "non-contact." As used herein, "electrically coupled" includes both direct and indirect electrical coupling unless stated otherwise. Although the discussion below focuses on non-contact reference signal type measurement devices, it should be appreciated that the calibration systems and methods disclosed herein may additionally or alternatively be used to calibration contact reference signal voltage measurement devices (e.g., a digital multimeter (DMM) that generates and detects reference signals).

Figure 1B:
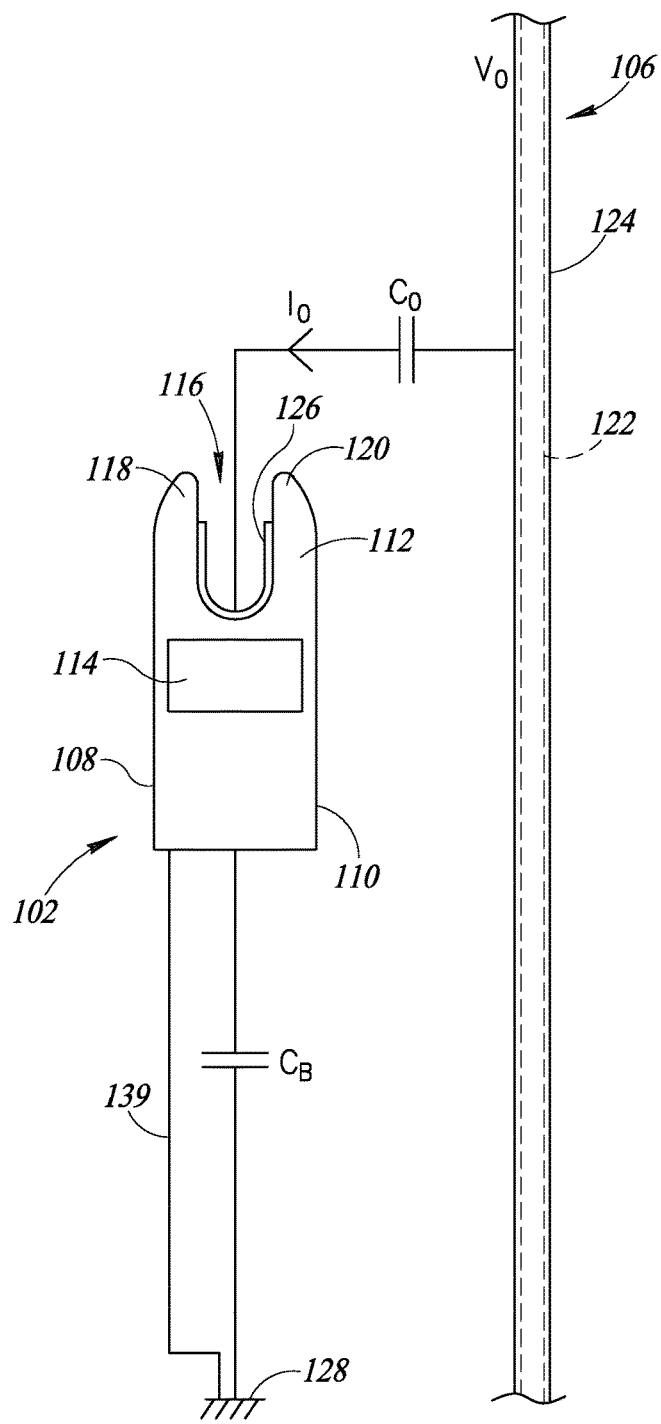
FIG. 1B is a top view of the non-contact voltage measurement device of FIG. 1A, showing a coupling capacitance formed between the insulated wire and a conductive sensor of the non-contact voltage measurement device, an insulated conductor current component, and a body capacitance between the non-contact voltage measurement device and the operator, according to one illustrated implementation.

FIG. 1A is a pictorial diagram of an environment 100 in which a non-contact voltage measurement device 102 that includes a reference signal type voltage sensor or system may be used by an operator 104 to measure AC voltage present in an insulated wire 106 without requiring galvanic contact between the non-contact voltage measurement device and the wire 106. FIG. 1B is a top plan view of the non-contact voltage measurement device 102 of FIG. 1A, showing various electrical characteristics of the non-contact voltage measurement device during operation. The non-contact voltage measurement device 102 includes a housing or body 108 which includes a grip portion or end 110 and a probe portion or end 112, also referred to herein as a front end, opposite the grip portion. The housing 108 may also include a user interface 114 which facilitates user interaction with the non-contact voltage measurement device 102. The user interface 114 may include any number of inputs (e.g., buttons, dials, switches, touch sensor) and any number of outputs (e.g., display, LEDs, speakers, buzzers). The non-contact voltage measurement device 102 may also include one or more wired and/or wireless communications interfaces (e.g., USB, Wi-Fi®, Bluetooth®).

In at least some implementations, as shown best in FIG. 1B, the probe portion 112 may include a recessed portion 116 defined by first and second extended portions 118 and 120. The recessed portion 116 receives the insulated wire 106 (see FIG. 1A). The insulated wire 106 includes a conductor 122 and an insulator 124 surrounding the conductor 122. The recessed portion 116 may include a sensor or electrode 126 which rests proximate the insulator 124 of the insulated wire 106 when the insulated wire is positioned within the recessed portion 116 of the non-contact voltage measurement device 102. Although not shown for clarity, the sensor 126 may be disposed inside of the housing 108 to prevent physical and electrical contact between the sensor and other objects.

As shown in FIG. 1A, in use the operator 104 may grasp the grip portion 110 of the housing 108 and place the probe portion 112 proximate the insulated wire 106 so that the non-contact voltage measurement device 102 may accurately measure the AC voltage present in the wire with respect to earth ground (or another reference node). Although the probe end 112 is shown as having the recessed portion 116, in other implementations the probe portion 112 may be configured differently. For example, in at least some implementations the probe portion 112 may include a selectively movable clamp, a hook, a flat or arcuate surface which includes the sensor, or other type of interface which allows a sensor of the non-contact voltage measurement device 102 to be positioned proximate the insulated wire 106. Examples of various probe portions and sensors are discussed below with reference to FIGS. 13 and 14.

The operator's body acting as a reference to earth/ground may only be in some implementations. Alternatively a direct connection to earth 128 via a test lead 139 can be used. The non-contact measurement functionality discussed herein is not limited to applications only measuring against earth. The outside reference may be capacitively or directly coupled to any other potential. For example, if the outside reference is capacitively coupled to another phase in three phase systems, the phase-to-phase voltages are measured. In general, the concepts discussed herein are not limited to reference against earth only using a body capacitive coupling connected to a reference voltage and any other reference potential.

As discussed further below, in at least some implementations, the non-contact voltage measurement device 102 may utilize the body capacitance ($C_B$) between the operator 104 and ground 128 during the AC voltage measurement. Although the term ground is used for the node 128, the node is not necessarily earth/ground but could be connected in a galvanically isolated manner to any other reference potential by capacitive coupling.

The particular systems and methods used by the non-contact voltage measurement device 102 to measure AC voltage are discussed below with reference to FIGS. 2-4.

Figure 2:
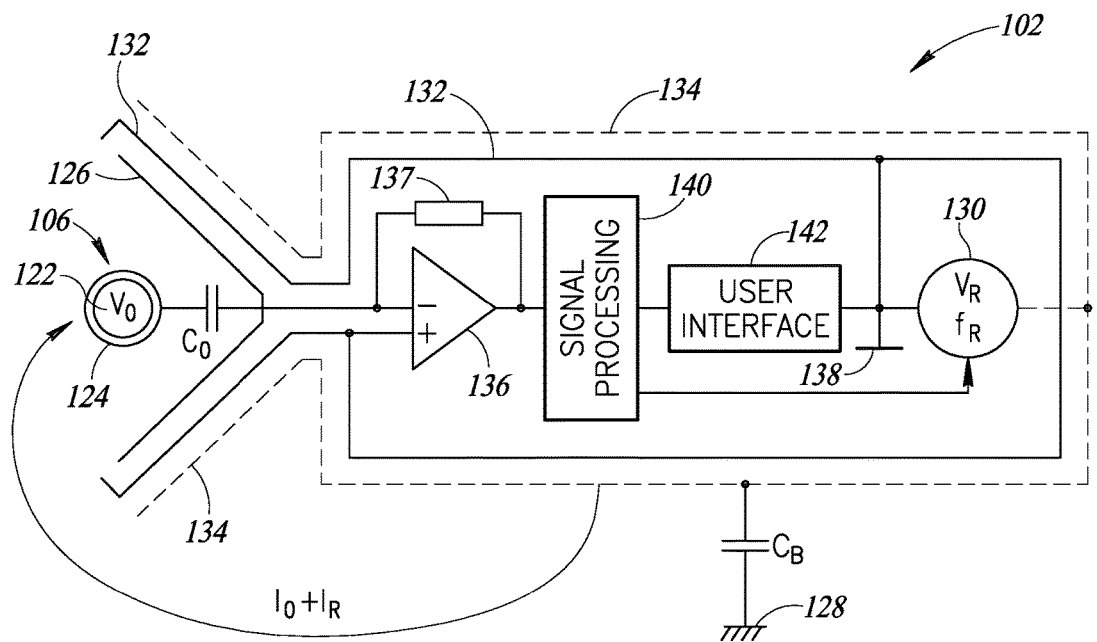
FIG. 2 is a schematic diagram of various internal components of a non-contact voltage measurement device, according to one illustrated implementation.

FIG. 2 shows a schematic diagram of various internal components of the non-contact voltage measurement device 102 also shown in FIGS. 1A and 1B. In this example, the conductive sensor 126 of the non-contact voltage measurement device 102 is substantially "V-shaped" and is positioned proximate the insulated wire 106 under test and capacitively couples with the conductor 122 of the insulated wire 106, forming a sensor coupling capacitor ($C_O$). The operator 104 handling the non-contact voltage measurement device 102 has a body capacitance ($C_B$) to ground. Also a direct conductive ground coupling by a wire (e.g., test lead 139) can be used as shown in FIGS. 1A and 1B. Thus, as shown in FIGS. 1B and 2, the AC voltage signal ($V_O$) in the wire 122 generates an insulated conductor current component or "signal current" ($I_O$) over the coupling capacitor ($C_O$) and the body capacitance ($C_B$), which are connected in series. In some implementations, the body capacitance ($C_B$) may also include a galvanically isolated test lead which generates a capacitance to ground or any other reference potential.

The AC voltage ($V_O$) in the wire 122 to be measured has a connection to an external ground 128 (e.g., neutral). The non-contact voltage measurement device 102 itself also has a capacitance to ground 128, which consists primarily of the body capacitance ($C_B$) when the operator 104 (FIG. 1) holds the non-contact voltage measurement device in his hand. Both capacitances $C_O$ and $C_B$ create a conductive loop and the voltage inside the loop generates the signal current ($I_O$). The signal current ($I_O$) is generated by the AC voltage signal ($V_O$) capacitively coupled to the conductive sensor 126 and loops back to the external ground 128 through the housing 108 of the non-contact voltage measurement device and the body capacitor ($C_B$) to ground 128. The current signal ($I_O$) is dependent on the distance between the conductive sensor 126 of the non-contact voltage measurement device 102 and the insulated wire 106 under test, the particular shape of the conductive sensor 126, and the size and voltage level ($V_O$) in the conductor 122.

To compensate for the distance variance and consequent coupling capacitor ($C_O$) variance which directly influences the signal current ($I_O$), the non-contact voltage measurement device 102 includes a common mode reference voltage source 130 which generates an AC reference voltage ($V_R$) which has a reference frequency ($f_R$) different from the signal voltage frequency (fo).

To reduce or avoid stray currents, at least a portion of the non-contact voltage measurement device 102 may be surrounded by a conductive internal ground guard or screen 132 which causes most of the current to run through the conductive sensor 126 that forms the coupling capacitor ($C_O$) with the conductor 122 of the insulated wire 106. The internal ground guard 132 may be formed from any suitable conductive material (e.g., copper) and may be solid (e.g., foil) or have one or more openings (e.g., mesh).

Further, to avoid currents between the internal ground guard 132 and the external ground 128, the non-contact voltage measurement device 102 includes a conductive reference shield 134. The reference shield 134 may be formed from any suitable conductive material (e.g., copper) and may be solid (e.g. sheet metal, sputtered metal inside a plastic enclosure, flexible (e.g., foil), or have one or more openings (e.g., mesh). The common mode reference voltage source 130 is electrically coupled between the reference shield 134 and the internal ground guard 132, which creates a common mode voltage or reference signal having the reference voltage ($V_R$) and the reference frequency ($f_R$) for the non-contact voltage measurement device 102. Such AC reference voltage ($V_R$) drives an additional reference current ($I_R$) through the coupling capacitor ($C_O$) and the body capacitor ($C_B$).

The internal ground guard 132 which surrounds at least a portion of the conductive sensor 126 protects the conductive sensor against direct influence of the AC reference voltage ($V_R$) causing an unwanted offset of reference current ($I_R$)

between the conductive sensor 126 and the reference shield 134. As noted above, the internal ground guard 132 is the internal electronic ground 138 for the non-contact voltage measurement device 102. In at least some implementations, the internal ground guard 132 also surrounds some or all of the electronics of the non-contact voltage measurement device 102 to avoid the AC reference voltage ($V_R$) coupling into the electronics.

As noted above, the reference shield 134 is utilized to inject a reference signal onto the input AC voltage signal ($V_O$) and, as a second function, minimizes the guard 132 to earth ground 128 capacitance. In at least some implementations, the reference shield 134 surrounds some or all of the housing 108 of the non-contact voltage measurement device 102. In such implementations, some or all of the electronics see the reference common mode signal which also generates the reference current ($I_R$) between the conductive sensor 126 and the conductor 122 in the insulated wire 106. In at least some implementations, the only gap in the reference shield 134 may be an opening for the conductive sensor 126 which allows the conductive sensor to be positioned proximate the insulated wire 106 during operation of the non-contact voltage measurement device 102.

The internal ground guard 132 and the reference shield 134 may provide a double layer screen around the housing 108 (see FIGS. 1A and 1B) of the non-contact voltage measurement device 102. The reference shield 134 may be disposed on an outside surface of the housing 108 and the internal ground guard 132 may function as an internal shield or guard. The conductive sensor 126 is shielded by the guard 132 against the reference shield 134 such that any reference current flow is generated by the coupling capacitor ($C_O$) between the conductive sensor 126 and the conductor 122 under test. The guard 132 around the sensor 126 also reduces stray influences of adjacent wires close to the sensor.

As shown in FIG. 2, the non-contact voltage measurement device 102 may include an input amplifier 136 which operates as an inverting current-to-voltage converter. The input amplifier 136 has a non-inverting terminal electrically coupled to the internal ground guard 132 which functions as the internal ground 138 of the non-contact voltage measurement device 102. An inverting terminal of the input amplifier 136 may be electrically coupled to the conductive sensor 126. Feedback circuitry 137 (e.g., feedback resistor) may also be coupled between the inverting terminal and the output terminal of the input amplifier 136 to provide feedback and appropriate gain for input signal conditioning.

The input amplifier 136 receives the signal current ($I_O$) and reference current ($I_R$) from the conductive sensor 126 and converts the received currents into a sensor current voltage signal indicative of the conductive sensor current at the output terminal of the input amplifier. The sensor current voltage signal may be an analog voltage, for example. The analog voltage may be fed to a signal processing module 140 which, as discussed further below, processes the sensor current voltage signal to determine the AC voltage ($V_O$) in the conductor 122 of the insulated wire 106. The signal processing module 140 may include any combination of digital and/or analog circuitry.

The non-contact voltage measurement device 102 may also include a user interface 142 (e.g., display) communicatively coupled to the signal processing module 140 to present the determined AC voltage ($V_O$) or to communicate by an interface to the operator 104 of the non-contact voltage measurement device.

Figure 3:
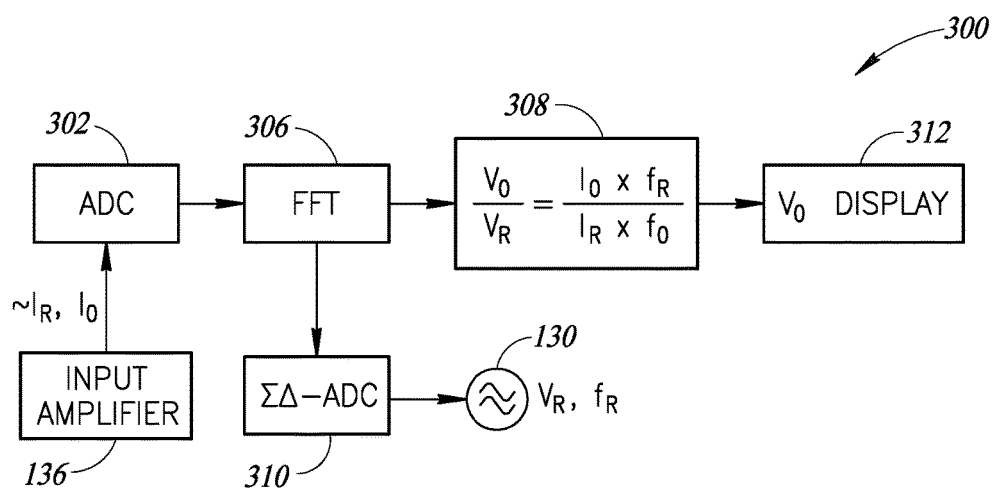
FIG. 3 is a block diagram which shows various signal processing components of a non-contact voltage measurement device, according to one illustrated implementation.
Figure 4:
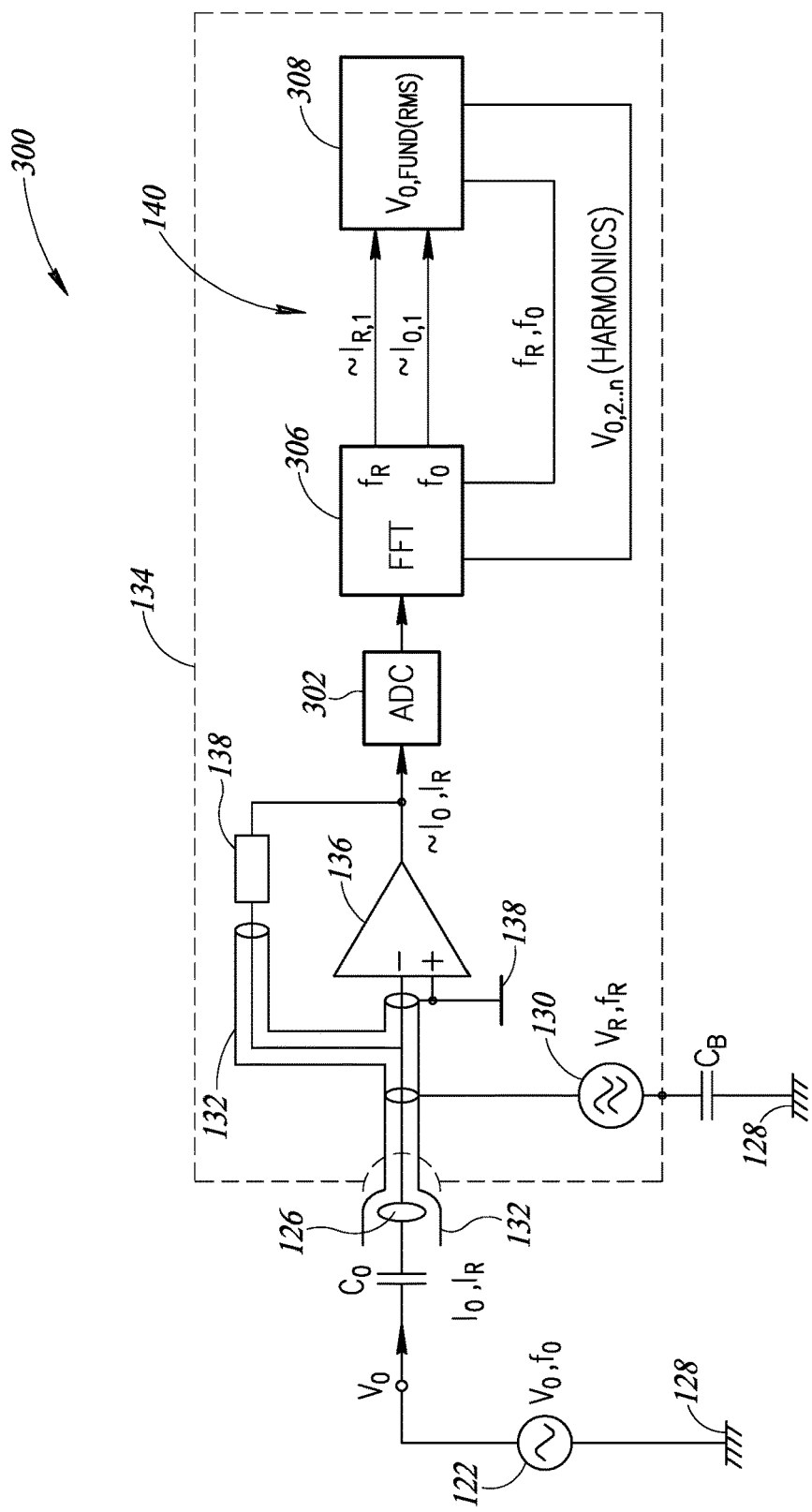
FIG. 4 is a schematic diagram of a non-contact voltage measurement device which implements a fast Fourier transform (FFT), according to one illustrated implementation.

FIG. 3 is a block diagram of a non-contact voltage measurement device 300 which shows various signal processing components of the non-contact voltage measurement device. FIG. 4 is a more detailed diagram of the non-contact voltage measurement device 300 of FIG. 3.

The non-contact voltage measurement device 300 may be similar or identical to the non-contact voltage measurement device 102 discussed above. Accordingly, similar or identical components are labeled with the same reference numerals. As shown, the input amplifier 136 converts the input current ($I_O+I_R$) from the conductive sensor 126 into a sensor current voltage signal which is indicative of the input current. The sensor current voltage signal is converted into digital form using an analog-to-digital converter (ADC) 302.

The AC voltage ($V_O$) in the wire 122 is related to the AC reference voltage ($V_R$) by Equation (1):

$$\frac{V_O}{V_R} = \frac{I_O \times f_R}{I_R \times f_O} \quad (1)$$

where ($I_O$) is the signal current through the conductive sensor 126 due to the AC voltage ($V_O$) in the conductor 122, ($I_R$) is the reference current through the conductive sensor 126 due to the AC reference voltage ($V_R$), ($f_O$) is the frequency of the AC voltage ($V_O$) that is being measured, and ($f_R$) is the frequency of the reference AC voltage ($V_R$).

The signals with indices "O," which are related to the AC voltage ($V_O$), have different characteristics like frequencies than the signals with indices "R," which are related to the common mode reference voltage source 130. In the implementation of FIG. 4, digital processing, such as circuitry implementing a fast Fourier transform (FFT) algorithm 306, may be used to separate signal magnitudes with different frequencies. In other implementations, analog electronic filters may also be used to separate "O" signal characteristics (e.g., magnitude, frequency) from "R" signal characteristics.

The currents ($I_O$) and ($I_R$) are dependent on the frequencies ($f_O$) and ($f_R$), respectively, due to the coupling capacitor ($C_O$). The currents flowing through the coupling capacitor ($C_O$) and the body capacitance ($C_B$) are proportional to the frequency and thus, the frequency ($f_O$) of the AC voltage ($V_O$) in the conductor 122 under test needs either to be measured to determine the ratio of the reference frequency ($f_R$) to the signal frequency ($f_O$), which is utilized in Equation (1) listed above or the reference frequency is already known because it is generated by the system itself.

Figure 7:
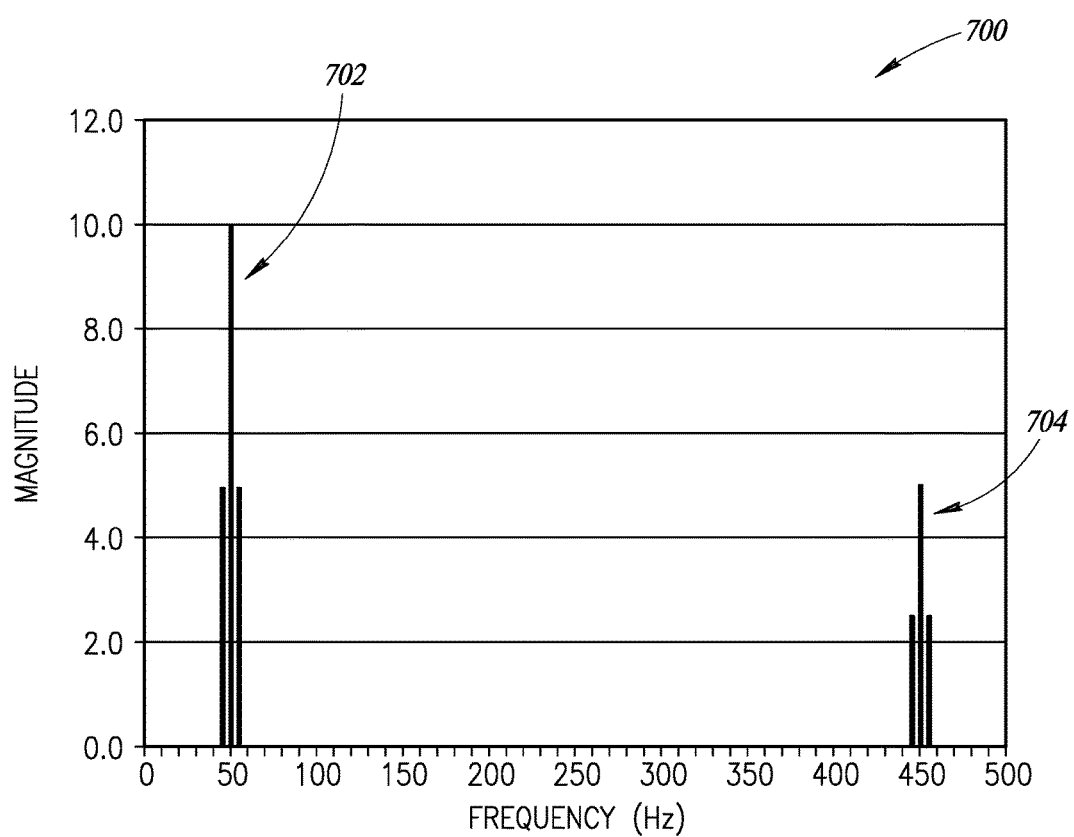
FIG. 7 is a graph that shows a frequency domain representation of a reference current and a signal current detected by a voltage measurement device, according to one illustrated implementation.

After the input current ($I_O+I_R$) has been conditioned by the input amplifier 136 and digitized by the ADC 302, the frequency components of the digital sensor current voltage signal may be determined by representing the signal in the frequency domain using the FFT 306 (see FIG. 7). When both of the frequencies ($f_O$) and ($f_R$) have been measured, frequency bins may be determined to calculate the fundamental magnitudes of the currents ($I_O$) and ($I_R$) from the FFT 306.

The magnitude of the current ($I_R$) and/or the current ($I_O$) may vary as a function of distance between the reference signal sensor or electrode (e.g., electrode 126) and the conductor 122 of the insulated wire 106. Thus, the system may compare the measured current ($I_R$) and/or the current ($I_O$) to expected respective currents to determine the distance between the reference signal sensor or electrode and the conductor 122.

Next, as indicated by a block 308 of FIG. 3, the ratio of the fundamental harmonics of the currents ($I_R$) and ($I_O$), designated $I_{R,1}$ and $I_{O,1}$, respectively may be corrected by the determined frequencies ($f_O$) and ($f_R$), and this factor may be used to calculate the measured original fundamental or RMS voltage by adding harmonics ($V_O$) in the wire 122, which is done by calculating the square root of the squared harmonics sum, and which may be presented to the user on a display 312.

The coupling capacitor ($C_O$) may generally have a capacitance value in the range of approximately 0.02 pF to 1 pF, for example, depending on the distance between the insulated conductor 106 and the conductive sensor 126, as well as the particular shape and dimensions of the sensor 126. The body capacitance ($C_B$) may have a capacitance value of approximately 20 pF to 200 pF, for example.

From Equation (1) above, it can be seen that the AC reference voltage ($V_R$) generated by the common mode reference voltage source 130 does not need to be in the same range as the AC voltage ($V_O$) in the conductor 122 to achieve similar current magnitudes for the signal current ($I_O$) and the reference current ($I_R$). The AC reference voltage ($V_R$) may be relatively low (e.g., less than 5 V) by selecting the reference frequency ($f_R$) to be relatively high. As an example, the reference frequency ($f_R$) may be selected to be 3 kHz, which is 50 times higher than a typical 120 VRMS AC voltage ($V_O$) having a signal frequency ($f_O$) of 60 Hz. In such case, the AC reference voltage ($V_R$) may be selected to be only 2.4 V (i.e., 120 V÷50) to generate the same reference current ($I_R$) as the signal current ($I_O$). In general, setting the reference frequency ($f_R$) to be N times the signal frequency ($f_O$) allows the AC reference voltage ($V_R$) to have a value that is (1/N) times the AC voltage ($V_O$) in the wire 122 to produce currents ($I_R$) and ($I_O$) that are in the same range as each other to achieve a similar uncertainty for $I_R$ and $I_O$.

Any suitable signal generator may be used to generate the AC reference voltage ($V_R$) having the reference frequency ($f_R$). In the example illustrated in FIG. 3, a Sigma-Delta digital-to-analog converter (Σ-Δ DAC) 310 is used. The Σ-Δ DAC 310 uses a bit stream to create a waveform (e.g., sinusoidal waveform) signal with the defined reference frequency ($f_R$) and AC reference voltage ($V_R$). In at least some implementations, the Σ-Δ DAC 310 may generate a waveform that is in phase with the window of the FFT 306 to reduce jitter. Any other reference voltage generator can be used, such as a PWM which may use less computing power than a Σ-Δ DAC.

In at least some implementations, the ADC 302 may have 14 bits of resolution. In operation, the ADC 302 may sample the output from the input amplifier 136 at a sampling frequency of 10.24 kHz for nominal 50 Hz input signals to provide $2^n$ samples (1024) in 100 ms (10 Hz bins for the FFT 306) ready for processing by the FFT 306. For 60 Hz input signals, the sampling frequency may be 12.288 kHz, for example, to get the same number of samples per cycle. The sampling frequency of the ADC 302 may be synchronized to full numbers of cycles of the reference frequency ($f_R$). The input signal frequency may be within a range of 40-70 Hz, for example. Depending on the measured frequency of the AC voltage ($V_O$), the bins for the AC voltage ($V_O$) may be determined using the FFT 306 and use a Hanning window function for further calculations to suppress phase shift jitter caused by incomplete signal cycles captured in the aggregation interval.

In one example, the common mode reference voltage source 130 generates an AC reference voltage ($V_R$) which has a reference frequency ($f_R$) of 2419 Hz. This frequency is in between the 40$^{th}$ harmonic and the 41$^{st}$ harmonic for 60 Hz signals, and between the 48$^{th}$ harmonic and 49$^{th}$ harmonic for 50 Hz signals. By providing an AC reference voltage ($V_R$) which has a reference frequency ($f_R$) that is not a harmonic of the expected AC voltage ($V_O$), the AC voltage ($V_O$) is less likely to influence measurement of the reference current ($I_R$).

In at least some implementations, the reference frequency ($f_R$) of the common mode reference voltage source 130 is selected to be a frequency that is least likely to be affected by harmonics of an AC voltage ($V_O$) in the conductor 122 under test. As an example, the common mode reference voltage source 130 may be switched off when the reference current ($I_R$) exceeds a limit, which may indicate that the conductive sensor 126 is approaching the conductor 122 under test. A measurement (e.g., 100 ms measurement) may be taken with the common mode reference voltage source 130 switched off to detect signal harmonics at a number (e.g., three, five) of candidate reference frequencies. Then, the magnitude of the signal harmonics in the AC voltage ($V_O$) may be determined at the number of candidate reference frequencies to identify which candidate reference frequency is likely to be least affected by the signal harmonics of the AC voltage ($V_O$). The reference frequency ($f_R$) may then be set to the identified candidate reference frequency. This switching of the reference frequency may avoid or reduce the impact of possible reference frequency components in the signal spectrum, which may increase the measured reference signal and reduce accuracy, and may create unstable results. Other frequencies besides 2419 Hz that have the same characteristics include 2344 Hz and 2679 Hz, for example.

Calibration Systems and Methods

As discussed above, the reference voltage ($V_R$) and the reference frequency ($f_R$) generated by the voltage measurement device are known and may be measured at the output of the reference voltage source 130 (FIG. 2). The output voltage ($V_O$) is defined by Equation (1) above. In an ideal situation, if the reference voltage ($V_R$) is known, and all other parameters needed are the ratios $I_O/I_R$ and $f_R/f_O$, then no calibration of the voltage measurement device would be required. However, in practice, there are several influencing factors, such as the bandwidth of signal processing circuitry and leakage capacitances, which lead to a deviation in output voltage measurements from the actual output voltage in a conductor under test. A primary factor is stray leakage capacitance between the sensor 126 (see FIG. 2) and the environment, which tends to cause an increase in the reference current ($I_R$) and therefore a reduction in the ratio $I_O/I_R$. Also, direct capacitive coupling between the sensor 126 and the reference shield 134 leads to an offset which further increases the reference current ($I_R$). Such an increase in the reference current ($I_R$) from the ideal situation results in a calculation of the output voltage ($V_O$) that is less than the actual output voltage in a conductor under test. Accordingly, the calibration systems and methods discussed herein allow for accurate measurement of output voltage ($V_O$) in a conductor under test using determined calibration parameters or factors that are dependent on the coupling capacitance ($C_O$) or, equivalently, the distance between the sensor 126 and the conductor under test.

Figure 5:
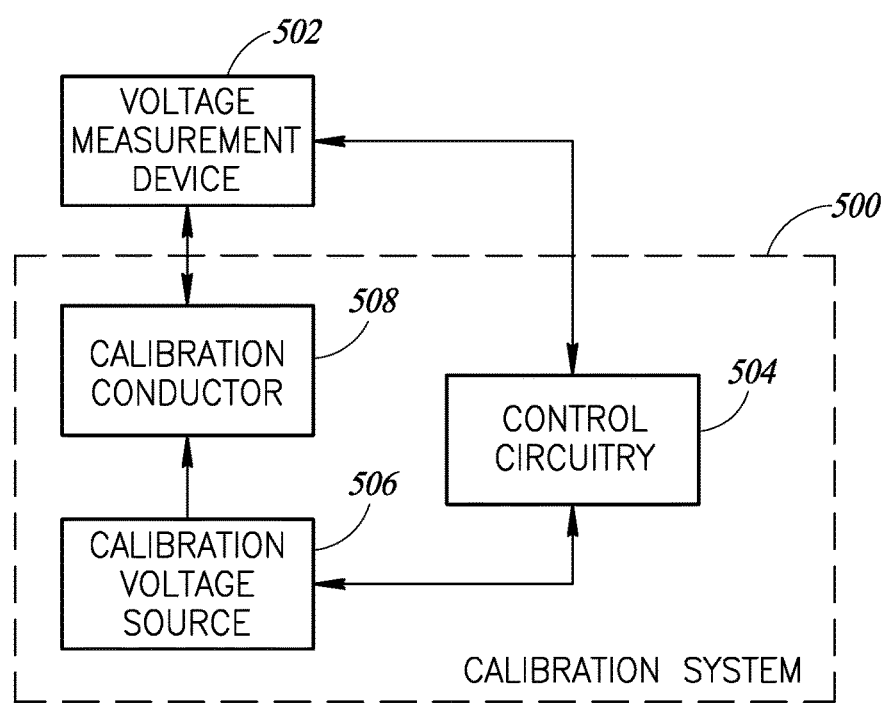
FIG. 5 is a schematic block diagram of a calibration system for a voltage measurement device, such as the voltage measurement devices shown in FIGS. 1A-4, according to one illustrated implementation.

FIG. 5 shows a schematic block diagram of a calibration system 500 that may be used to calibrate a voltage measurement device 502. The voltage measurement device may be any non-contact or contact measurement device that generates and senses a reference signal, such as the voltage measurement devices discussed above. The calibration system 500 may include control circuitry 504 which controls the various functionality of the calibration system. The calibration system 500 may also include a calibration voltage source 506 that is operative to selectively output calibration or test voltages to a calibration conductor 508. The control circuitry 504 may be operatively coupled to the calibration voltage source 506 to control the operation thereof. The calibration conductor 508 may be an insulated conductor for use in calibrating non-contact voltage measurement devices, or may be an uninsulated conductor for use in calibrating contact type voltage measurement devices.

The control circuitry 504 of the calibration system 500 may be operatively coupled to the voltage measurement device 502 by any suitable wired or wireless connection. As discussed further below, the control circuitry 504 may be operative to send instructions or data to the voltage measurement device 500 or to receive instructions or data therefrom. The control circuitry 504 also controls the distance between the wire 122 and the sensor 126 to vary $C_O$ and therefore modifying $I_R$ for different calibration points.

Generally, the control circuitry 504 may include at least one processor communicatively coupled to the calibration voltage source 506 and to at least one nontransitory processor-readable storage medium that stores at least one of processor-executable instructions or data. The control circuitry 504 may include any type of processing unit, such as one or more central processing units (CPUs), digital signal processors (DSPs), application-specific integrated circuits (ASICs), field programmable gate arrays (FPGAs), programmable logic controllers (PLCs), artificial neural network circuits or systems, or any other discrete or integrated logic components. The nontransitory processor-readable storage medium coupled to the control circuitry 504 may include any type of nontransitory volatile and/or non-volatile memory.

In at least some implementations, control circuitry 504 may include a communications interface or a user interface. The user interface may facilitate user interaction with the calibration system 500. The user interface may include any number of inputs (e.g., buttons, dials, switches, touch sensor) and any number of outputs (e.g., display, LEDs, speakers, buzzers). For example, the user interface may include inputs that allow an operator to modify one or more adjustable settings of the calibration system 500 or the voltage measurement device 502. The communications interface may implement one or more wired and/or wireless communications technologies (e.g., USB, Wi-Fi®, Bluetooth®) that allow the calibration system 500 to communicate with the voltage measurement device 502 or with one or more local or remote external processor-based devices.

The inventor of the present disclosure has found that the output voltage ($V_O$) measurements of the voltage measurement device 502 may be dependent on the measured reference current signal ($I_R$) and/or the actual output voltage in the conductor under test. Thus, the calibration systems and methods discussed herein provide compensation for one or both of such parameters to allow for accurate measurement of the output voltage ($V_O$) at various voltages and various distances between the sensor of the voltage measurement device 502 and the conductor under test, which various distances correspond to various levels of reference current ($I_R$).

Generally, during a calibration process, the control circuitry 504 controls the calibration voltage source 506 to output a known calibration voltage (e.g., 100 VAC, 250 VAC, 800 VAC) to the calibration conductor 508. The control circuitry 504 then receives data from the voltage measurement device 502 obtained by the voltage measurement device during measurement of the calibration voltage in the calibration conductor 508. Such data may include measured reference current signals ($I_R$), determined output voltages ($V_O$), etc. The voltage measurement device 502 may obtain such data in the manner discussed above with reference to FIGS. 1A-4, for example. This process may be repeated a number of times at different calibration voltages. Further, different reference current signal measurements may be obtained by selectively varying the distance between the sensor (e.g., sensor 126) of the voltage measurement device 502 and the calibration conductor 508, as the detected reference current signal ($I_R$) is dependent on the such distance due to the change coupling capacitance ($C_O$) (see FIG. 2) with change in distance.

For each of a plurality of calibration voltages (e.g., 100 VAC, 250 VAC, 800 VAC), the control circuitry 504 may obtain a plurality of calibration points associated with the calibration voltage. In at least some implementations, each of the calibration points includes a reference current signal data point and a calibration factor. The reference current signal data point is a measurement obtained from the voltage measurement device 502 that is indicative of the reference current signal that is measured by the voltage measurement device when the calibration voltage source 506 outputs the calibration voltage in the calibration conductor 508. The calibration factor is a value indicative of a ratio of the known calibration voltage to a measured uncalibrated output voltage ($V_O$) data point obtained from the voltage measurement device that is determined by the voltage measurement device based at least in part on the reference current signal data point (e.g., using Equation (1) above). For example, if the control circuitry 504 causes the calibration voltage source 506 to output 100 VAC in the calibration conductor 508, and the voltage measurement device 502 measures an output voltage of 110 VAC, then the calibration factor would be 100/110=0.909. For a particular measurement, the uncalibrated output voltage measured by the voltage measurement device 502 may be multiplied by the calibration factor to provide the correct output voltage. Continuing with the example above, the uncalibrated output voltage of 110 VAC may be multiplied by the calibration factor of 0.909 to provide the actual output voltage of 100 VAC in the conductor under test.

As discussed further below, after obtaining calibration points, the control circuitry 504 may determine calibration data for the voltage measurement device 502 based on the obtained plurality of calibration points. The calibration data may be dependent on the reference current signal measured by the voltage measurement device. In at least some implementations, the calibration data may also be dependent on a plurality of calibration voltages. The control circuitry 504 may then store the calibration data on at least one nontransitory processor-readable storage medium associated with the voltage measurement device 502 for use by the voltage measurement device during subsequent operation thereof. The calibration data may include one or more lookup tables and/or coefficients for one or more mathematical formulas, as discussed below.

Figure 6:
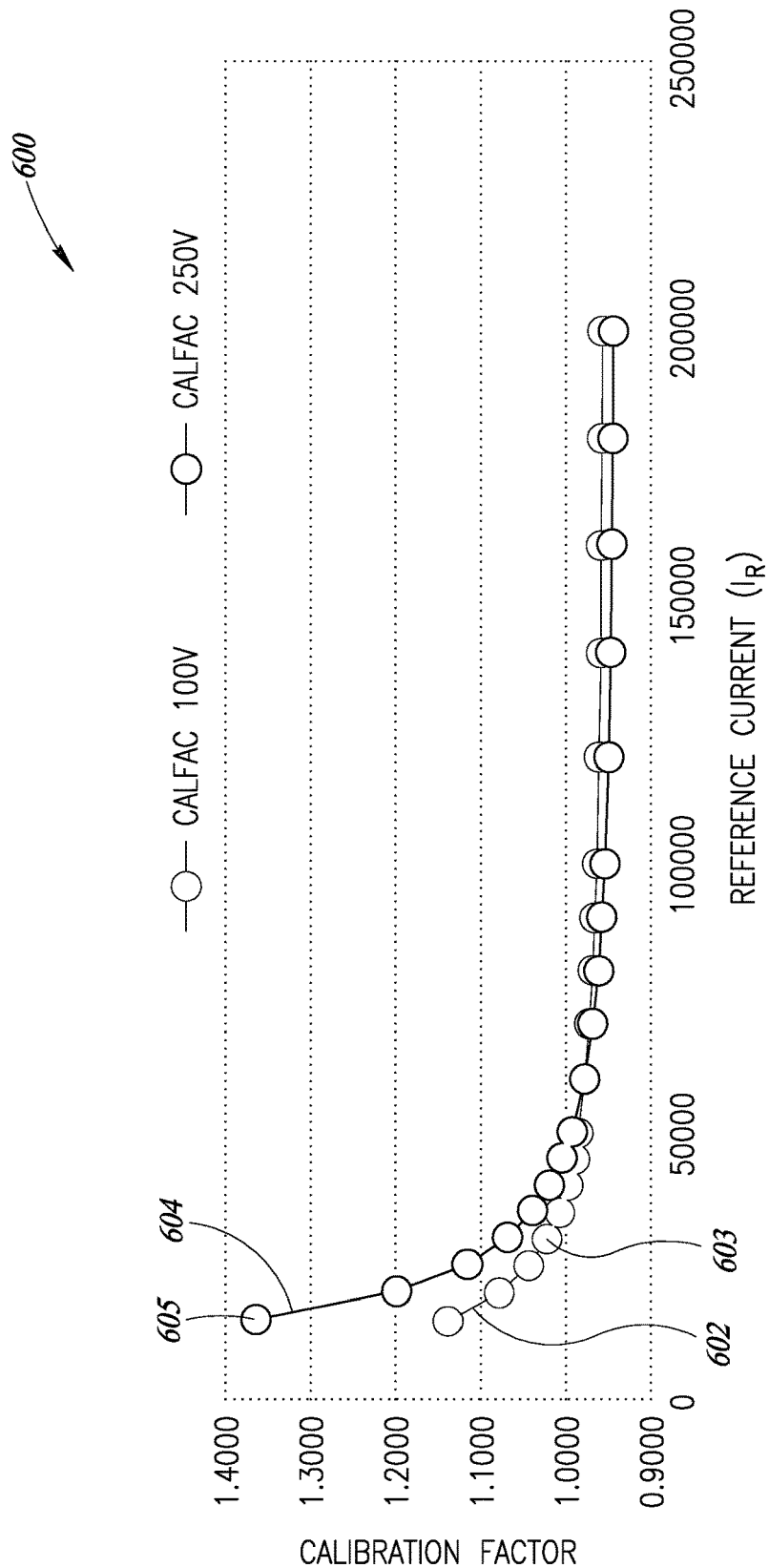
FIG. 6 is a graph that shows a relationship between a reference current detected by a voltage measurement device and a calibration factor for two calibration voltages, according to one illustrated implementation.

FIG. 6 shows a graph 600 of a curve 602 that is mapped to calibration points 603 obtained at a calibration voltage of 100 VAC, and a curve 604 mapped to calibration points 605 obtained at a calibration voltage 250 VAC. Each calibration point comprises a reference current signal ($I_R$) value and a corresponding calibration factor determined using the known calibration voltage (i.e., 100 VAC or 250 VAC) and the calculated uncalibrated output voltage ($V_O$) obtained from the voltage measurement device.

FIG. 7 is a graph 700 that shows a frequency domain representation of a measured signal current ($I_O$), referenced by arrow 702, and a measured reference current ($I_R$), referenced by arrow 704, that are measured by a voltage measurement device. As discussed above, the voltage measurement device may utilize an FFT to separate the signal current from the reference current. The frequency bin magnitudes of the signal current ($I_O$) at the signal frequency ($f_O$) and the reference current ($I_R$) at the reference frequency ($f_R$) are used for the signal and reference magnitudes, respectively. In the example of FIG. 7, the Hanning window produces 50% side bins at the signal frequency ($f_O$) of 50 Hz and the reference frequency ($f_R$) of 450 Hz.

Figure 8:
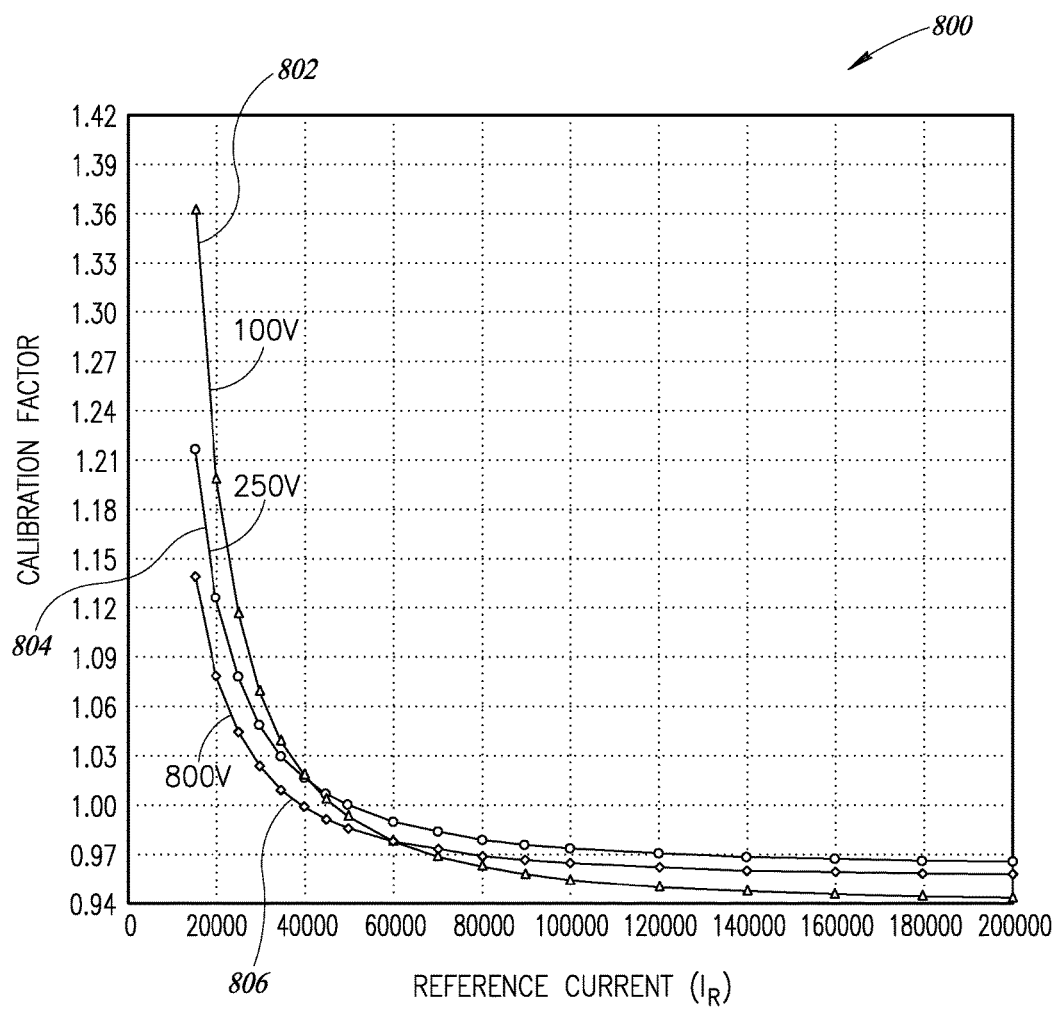
FIG. 8 is a graph that shows a relationship between a reference current detected by a voltage measurement device and a calibration factor for three calibration voltages, according to one illustrated implementation.

FIG. 8 is a graph 800 that shows curves 802, 804, 806 mapped to calibration points for calibration voltages of 100 VAC, 250 VAC, and 800 VAC, respectively. In other implementations, more or fewer calibration voltages may be used. In the illustrated example, the calibration voltages were selected to be near common supply voltages of 115 VAC and 230 VAC, and to be near a selected upper range of 1000 VAC, which upper range may be selected to be other values dependent on the particular intended application.

For each calibration voltage, the control circuitry of the calibration system obtains measurements at different distances between the sensor of the voltage measurement device and the calibration conductor to provide a range of reference currents ($I_R$). In the illustrated example, for each calibration voltage, about 20 reference current values ranging from about 16,000 FFT units to about 200,000 FFT units are obtained. The particular range and number of reference current values obtained during the calibration process may depend on various factors, such as the amount of memory or computation required, degree of accuracy required, the acceptable physical distance between the sensor of the voltage measurement device and the calibration conductor during normal use, etc.

FIG. 9 is a two dimensional lookup table 900 of example calibration data generated by a calibration system, such as the calibration system 500 of FIG. 5. In at least some implementations, after the calibration system has generated the calibration data, the calibration data may be stored on a nontransitory processor-readable storage medium of a voltage measurement device for use thereby to accurately determine the voltage in a conductor under test. In this example, 19 calibration points are obtained for each of a plurality of calibration voltages. The calibration voltages are 100 VAC, 250 VAC, and 800 VAC in this example. For each calibration voltage, a calibration point includes a reference current signal value ($I_R$) and a calibration factor value (CALFAC). For calibration point number 1 at the top of the lookup table 900, a large value of 999998 is artificially chosen for the reference current, and the calibration factor for calibration point 2 of each calibration voltage is copied as the calibration factor for calibration point 1. This is done to avoid extrapolation uncertainty in cases for reference current signals that are greater than the maximum reference current signals obtained during the calibration process. For example, measurement of wires that are thicker than the wire(s) used for calibration or have thicker insulation material that has a higher permittivity may also increase $I_R$ to values that may be above the maximum calibration current $I_R$.

Using the lookup table 900, the voltage measurement device may utilize a bilinear calibration function dependent on the reference current ($I_R$) and an uncalibrated output voltage ($V_O$) to determine a calibration factor to use to correct the uncalibrated output voltage ($V_O$) measurement during operation. The voltage measurement device may utilize interpolation and extrapolation to cover essentially all possible values of reference current measurements. Artificial calibration point 1 allows for using interpolation instead of extrapolation to be performed for high values of reference current obtained when the sensor of the voltage measurement device is positioned very close to the conductor under test.

Figure 10:
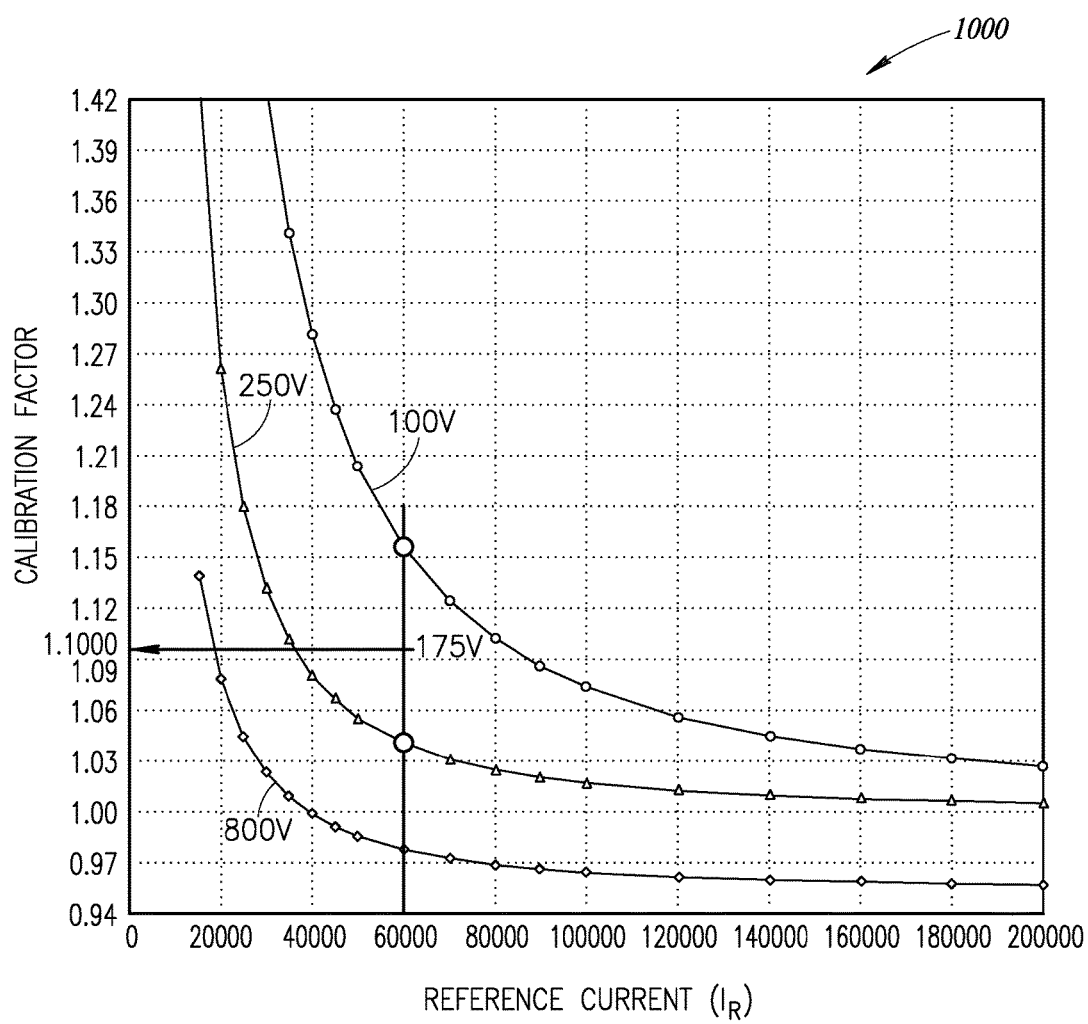
FIG. 10 is a graph that shows a relationship between a reference current detected by a voltage measurement device and a calibration factor for three calibration voltages, and which shows an example interpolation process for determining a calibration factor, according to one illustrated implementation.

FIG. 10 shows a graph 1000 that depicts calibration factor/reference current curves for calibration voltages of 100 VAC, 250 VAC, and 800 VAC. In this example, the voltage measurement device measured an uncalibrated output voltage of 175 VAC, and a reference current of 60,000 FFT units. The graph 1000 shows an example interpolation process for determining a calibration factor for such input values using the calibration data, which calibration factor may be used by the voltage measurement device to correct the uncalibrated output voltage measurement.

In the simplified example of FIG. 10, the calibration factor for 175 VAC is determined to be equal to 1.1000, which is midway between the calibration factors for 100 VAC and 250 VAC at a reference current of 60,000 FFT units. In practice, since the uncalibrated measured output voltage (e.g., 175 VAC) may not be very accurate, a more complex calculation may be used that accounts for how the particular voltage measurement device performs at the calibration points.

In at least some implementations, instead of utilizing a lookup table stored on the voltage measurement device, one or more mathematical formulas may be fit to the calibration data. In such implementations, rather than a large amount of data required for a lookup table, coefficients of one or more mathematical formulas may be stored on an nontransitory processor-readable storage medium of the voltage measurement device and, during runtime, the voltage measurement device may simply evaluate the one or more mathematical formulas using the coefficients and the measured values (e.g., reference current, uncalibrated output voltage) to determine the calibration factor to be applied to the uncalibrated output voltage measurement.

It has been determined that most of the measurement error for uncalibrated measurements is due to the direct coupling of the reference voltage ($V_R$) to the sensor of the voltage measurement device, which generates an offset current ($I_{RO}$) to the reference current ($I_R$). This can be expressed by the following formula:

$$V_O = \frac{I_O \times f_R}{(I_R - I_{RO}) \times f_O} \times V_R \quad (2)$$

This results in a quadratic curve fitting function of the form:

$$y = \frac{a}{(x-b)^2} + d \quad (3)$$

where 'y' is the output voltage, 'x' is the reference current, and 'a,' 'b,' and 'd' are variables that can be solved using a solver (e.g., the solver available in Microsoft Excel®) and the obtained calibration data. To further improve the approximation, the squared function could also be a variable 'c,' which provides the following formula:

$$y = \frac{a}{(x-b)^c} + d \quad (4)$$

In at least some implementations, the calibration data is used to solve for the variables 'a,' 'b,' 'c,' and 'd' for each of the calibration voltages. The solver may be used to solve for the values of the variables 'a,' 'b,' 'c,' and 'd' that minimize the deviation of the curve from a corresponding interpolated curve (see FIG. 11). Thus, for each calibration voltage, only four parameters (i.e., parameters 'a,' 'b,' 'c,' and 'd') are required to be stored by the voltage measurement device. In the example above that utilizes three calibration voltages, a total of 12 parameters, 4 parameters for each of the 3 calibration voltages, would need to be stored by the voltage measurement device.

Figure 11:
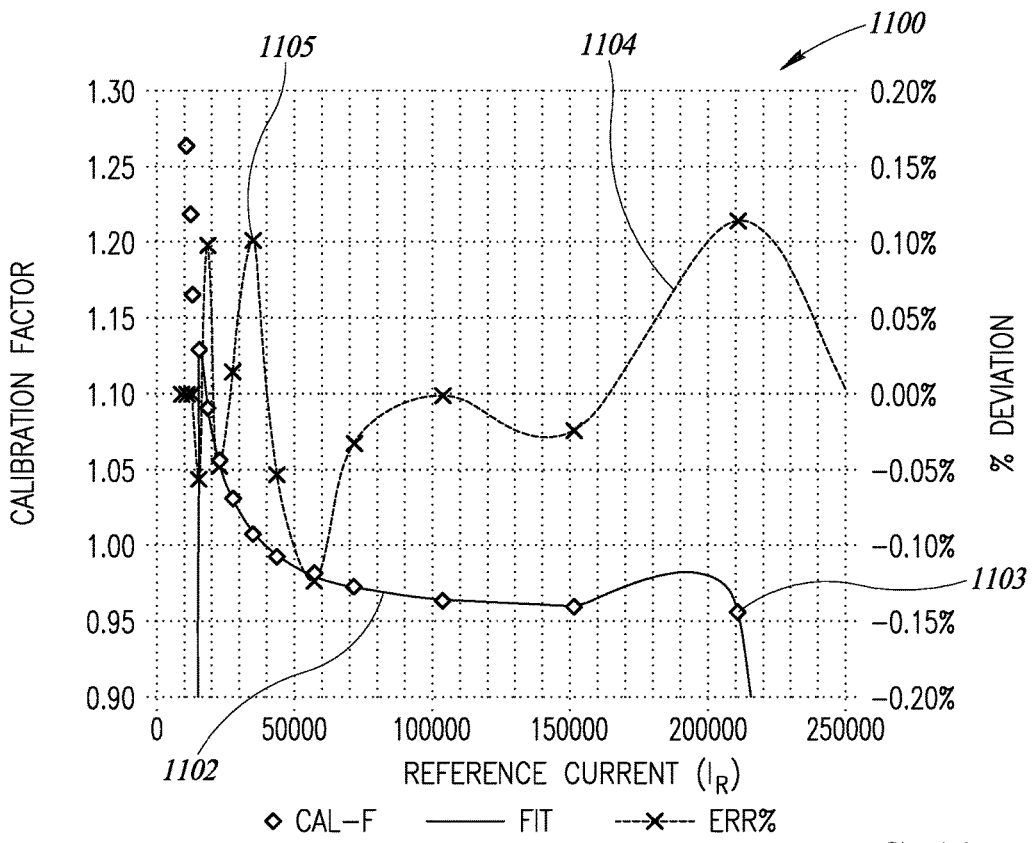
FIG. 11 is a graph that shows a curve that defines a relationship between a reference current detected by a voltage measurement device and a calibration factor, and that also shows a plurality of points of a mathematical formula that is fit to the curve, and a percent deviation of the mathematical formula, according to one illustrated implementation.

FIG. 11 is a graph 1100 that shows a curve 1102 fit to a plurality of calibration points 1103 obtained for a particular calibration voltage. The curve 1102 is fit using the mathematical formula (4) above. The graph 1100 also shows a deviation curve 1104 for deviation points 1105. As shown, the maximum deviation from an interpolated curve is less than 0.15%. Thus, similar accuracy is achieved using only 12 parameters instead of a lookup table that includes 120 parameters (see FIG. 9).

It has been observed that for at least some voltage measurement devices, the curve characteristics for each calibration voltage do not differ by much, only the vertical offset determined by the variable 'd' in mathematical formulas (3) and (4) above. Thus, in at least some implementations, the curve parameters 'a,' 'b,' and 'c' may be the same for each of the calibration voltages, and only the offset parameter 'd' may be different for each of the calibration voltages. In such instances, the voltage measurement device may store a total of only 6 parameters, one 'a' parameter, one 'b' parameter, one 'c' parameter, and three 'd' parameters, one for each of the three calibration voltages.

In operation, the voltage measurement device may, for a measured reference current and determined uncalibrated output voltage, interpolate the calibration voltage curves that are adjacent the measured uncalibrated voltage. For example, if the voltage measurement device measures 175 VAC, the voltage measurement device may interpolate between the curves for a 100 VAC calibration voltage and a 250 VAC calibration voltage.

Figure 12:
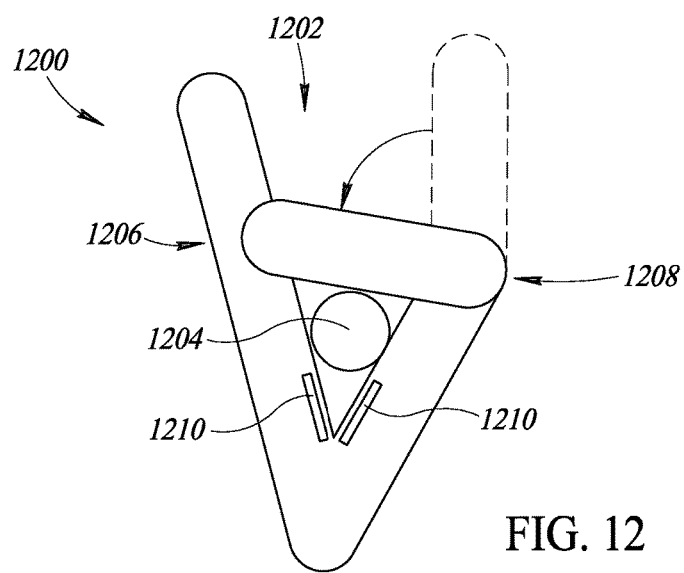
FIG. 12 is a pictorial diagram of a front or probe end of a voltage measurement device that includes a plurality of sensors, the front end including a movable clamp that selectively maintains a conductor (e.g., insulated conductor) in a fixed position during a measurement process, according to one illustrated implementation.

FIG. 12 is a pictorial diagram of a front or probe end 1200 of a voltage measurement device. The front end 1200 includes a V-shaped area 1202 that receives a conductor 1204 under test therein. The V-shaped area 1202 is defined by a fixed first portion 1206 and a movable second portion 1208 opposite the first portion. In this example, the movable second portion is selectively rotatable from an open position shown in dashed lines wherein the conductor 1204 may be freely inserted into and removed from the V-shaped area 1202, and a closed position shown in solid lines wherein the conductor is clamped into a fixed position so electrical characteristics (e.g., voltage, current) in the conductor may be measured. In at least some implementations, the second portion 1208 of the front end 1200 is fixed, which allows the conductor 1204 to be positioned substantially anywhere in the V-shaped area 1202 during a measurement operation.

In the illustrated implementation, the front end 1200 includes a plurality of sensors 1210 (two shown). The number of sensor may be two sensors, three sensors, ten sensors, or more. One or more of the sensors may be used to sense the reference current generated by one or more reference voltage sources (e.g., reference voltage source 130 of FIG. 2), as discussed above with reference to implementations that include a single sensor. To further reduce environmental stray current to the sensor 1210, the movable second portion 1208 may be also used for shielding the sensor by including a conductive guard, similar to the guard 132 discussed above.

In the implementation discussed above, the reference current ($I_R$) and the output voltage ($V_O$) are used for bilinear calibration. In at least some implementations, the output voltage parameter may not be needed, so the calibration may depend on the reference current only. In implementations that utilize two sensors, such as the sensors 1210 shown in FIG. 12, two reference currents ($I_{R1}$) and ($I_{R2}$) may be detected and used in a bilinear calibration, similar to the methods discussed above that utilize one reference current signal and one voltage signal. This feature may be utilized to compensate not only for the distance between the sensors and the conductor under test but also for the position of the conductor in the sensing area (e.g., the V-shaped area 1202 shown in FIG. 12).

Figure 13:
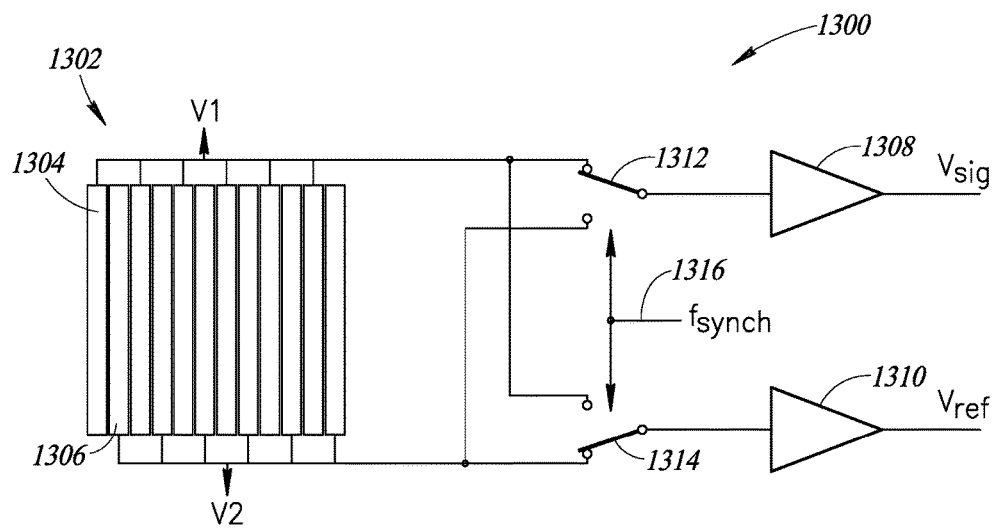
FIG. 13 is a schematic diagram of a sensor array that includes a first sensor array portion having a first plurality of sensor elements, and a second sensor array portion having a second plurality of sensor elements, wherein the first plurality of sensor elements are interleaved with the second plurality of sensor elements, according to one illustrated implementation.

As an additional calibration improvement, the sensor may be split into multiple pairs of sensors. FIG. 13 is a schematic diagram of a sensor subsystem 1300 that includes a sensor array 1302. The sensor array 1302 includes a first sensor array portion having a first plurality of sensor elements 1304 ("first sensor portion"), and a second sensor array portion having a second plurality of sensor elements 1306 ("second sensor portion"). The first plurality of sensor elements 1304 are interleaved with the second plurality of sensor elements 1306.

Each of the first plurality of sensor elements 1304 is coupled to a node V1 that is alternatingly coupled to a signal current amplifier 1308 and a reference current amplifier 1310 via switches 1312 and 1314, respectively, that are controlled by a switch control signal ($f_{synch}$) 1316. Similarly, each of the second plurality of sensor elements 1306 is coupled to a node V2 that is alternatingly coupled to amplifiers 1308 and 1310 via the switches 1312 and 1314, respectively. The signal current amplifier 1308 may be coupled to processing circuitry configured for processing signal currents $I_O$, and the reference current amplifier 1310 may be coupled to processing circuitry configured for processing reference currents $I_R$. The amplifiers 1308 and 1310 may be similar or identical to the amplifier 136 discussed above.

Each of the first plurality of sensor elements 1304 and the second plurality of sensor elements 1306 may be the same shape to separate the signal and reference currents prior to the analog signal conditioning circuitry. This configuration allows for use of different filters and amplification for the signal current and the reference current to optimize signal quality and range for both signals.

To compensate for any position dependent unbalance, especially at the edges, the switch control 1316 may operate with a 50% duty cycle to alternatingly couple the first plurality of sensors 1304 to the signal current amplifier 1308 and the reference current amplifier 1310, and to alternatingly couple the second plurality of sensors 1306 to the signal current amplifier 1308 and the reference current amplifier 1310. This has the effect of averaging out any local geometric unbalance.

The signal magnitude for each of the first and second plurality of sensors will be 50% of the signal magnitude compared to a single, larger sensor. However, since the signal current and the reference current are processed separately, signal conditioning circuitry (e.g., gain, frequency) may be advantageously optimized for each of the particular currents.

In at least some implementations, the switching frequency ($f_{synch}$) may be synchronized to the measurement interval (e.g., 100 ms), to ensure that full cycles are averaged. For example, the switching frequency may be selected to switch with full cycles of the reference frequency $f_R$ or greater than 2× the reference frequency and at multiple values of the reference frequency.

In at least some implementations, three or more sensors may be used to compensate for the xy position of the conductor under test. One example application is a non-contact voltage measurement device that utilizes a hard jaw current clamp, wherein the position of the conductor under test may be anywhere within the jaw.

Figure 14:
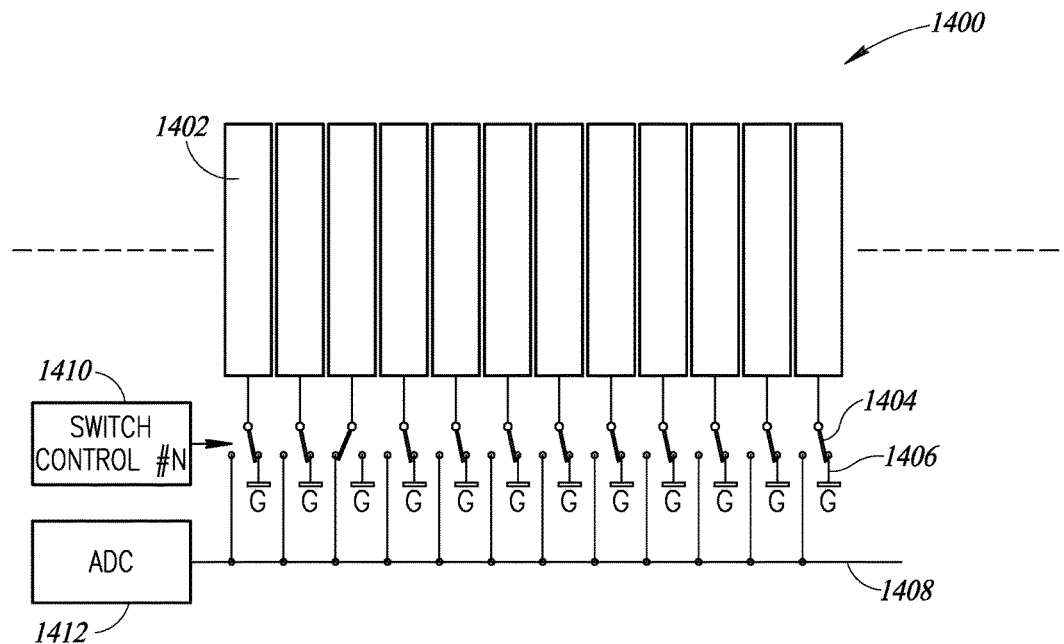
FIG. 14 is a schematic diagram of a sensor array for a non-contact voltage measurement device, wherein the sensor array includes a plurality of sensor elements, according to one illustrated implementation.

Instead of using a movable part (e.g., the movable portion 1208 shown in FIG. 12) to position the wire close to the sensor, a multiple sensor array may be used. FIG. 14 is a schematic diagram of a sensor array 1400 for a non-contact voltage measurement device. The sensor array includes a plurality of sensor elements 1402. Each of the plurality of sensor elements 1402 is coupled to a respective switch 1404 that is controlled by a switch controller 1410 coupled to the switches. The switch controller 1410 is operative to control the switches 1404 to selectively couple each of the sensor elements 1402 to either an input node 1408 that is fed to an input of an ADC 1412, or to a conductive guard node 1406 (e.g., guard 132 discussed above).

As discussed above, the sensor array 1400 may be used to obtain more information with multiple parameter calibration using multiple reference currents $I_R$ measured by the sensors in a two dimensional calibration procedure using a multi-parameter (e.g. trilinear for 3 sensors, etc.) interpolation instead of the above-described bilinear interpolation. The measurement may either use all of the sensors 1402 in parallel, wherein each of the sensors 1402 in the sensor array 1400 has a separate connection to the processing electronics (e.g., ADC, etc.) or, as shown in FIG. 14, the sensors 1402 may be multiplexed and only one sensor of the sensor array 1400 is active at one moment in time.

In at least some implementations, the individual sensor currents from each of the sensors 1402 may be tested prior to a measurement to identify the sensor that produces the maximum reference current $I_R$, and only this identified sensor is used for the measurement. This feature may be described as electronically locating the one (or more) sensor 1402 that is the closest to the wire under test, and then using that sensor for the measurement. In at least some implementations, the other unused sensors may be coupled via the switches 1404 to the guard node 1406, so the other sensors act as a guard during the measurement. The measurement itself may operate similarly or identically to the above-described one sensor arrangement.

This method for wire location dependent calibration may also be used to compensate for magnetic deviation for current measurements. For example, this method may be used in Rogowski coils to improve accuracy independent of position of the conductor under test.

In such implementations that utilize three sensors, a trilinear calibration dependent on reference currents $(I_{R1})$, $(I_{R2})$ and $(I_{R3})$ may be performed to obtain a linear approximation for all possible xy coordinates within the jaw area of a measurement device. The result is an array of calibration factors (e.g., C(x,y)) that may be interpolated between the actual reference currents $(I_{R1})$, $(I_{R2})$ and $(I_{R3})$ detected by the three sensors of the measurement device.

In at least some implementations of the voltage measurement devices discussed herein, the reference voltage $(V_R)$ may have multiple frequencies to reduce signal harmonics or interharmonic influence on the measured reference current $(I_R)$ caused by higher frequency components of the signal voltage $(V_O)$. For example, the reference voltage source (e.g., source 130 of FIG. 2) may be periodically switched off and the FFT frequency bins around the multiple reference frequencies may be analyzed and checked against a relative limit. The lowest value may be used to define a selected reference frequency $(f_R)$ that is least disturbed by the signal voltage $(V_O)$ or other influencing factors.

In at least some implementations, the switching off of the reference voltage source may not necessarily generate a gap in the measurement stream. For example, the signal current $(I_O)$ may still be measured when the reference voltage source is switched off, and a reference current $(I_R)$ measured during the previous interval may be used to estimate the reference current for the interval in which the reference voltage source is switched off.

To further reduce any errors caused by the bandwidth influence of the variable frequencies of the reference frequency $(f_R)$, the calibration factors may be modified by multiplying them with a constant calibration factor that is dependent on the reference frequency $(f_R)$ that is determined in an additional calibration cycle by storing the deviation of the calibration factor at different reference frequencies in relation to a default reference frequency (e.g., 2419 Hz).

In addition to the reference frequency switching discussed above, other dedicated signal characteristics of the reference signal may be used. Examples include amplitude or frequency modulation, synchronous or pseudo-stochastic switching, quadrature modulation, phase switching, etc.

As an example of using a modulated signal, the reference signal may be modulated with a modulation frequency $f_m$. In at least some implementations, the modulation frequency $f_m$ may be selected to lie exactly at an integer number of FFT bins. For example, for a 100 ms FFT interval, such frequencies would be frequencies of 10 Hz, 20 Hz, 30 Hz, etc. In the absence of noise at the carrier or reference frequency $(f_R)$, this results in two symmetrical side bands, one on each side of the reference frequency.

If both of the two side bands do not have the same magnitude, it can be determined that the reference signal is disturbed (e.g., by the signal voltage $(V_O)$). This is a relatively simple identification process that does not require switching the reference voltage source off. If the reference signal is found to be disturbed, the system may shift the reference frequency by an amount $\Delta f$ and again check the side bands for symmetry until a suitable (undisturbed) reference frequency is identified.

To further speed up the process, in at least some implementations, multiple reference frequencies may be used at the same time. This frequency mixture can be created either by predetermined tables and bit streaming (e.g., $\Sigma\Delta$ DAC bit streaming), or by analog addition of low pass filtered outputs of pulse width modulators (PWM), for example. If PWMs are used, a pair of PWMs may provide a reference frequency and a modulation frequency, and multiple pairs of PWMs may be used to provide multiple reference frequencies and multiple corresponding modulation frequencies.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations. Aspects of the implementations can be modified, if necessary, to employ systems, circuits and concepts of the various patents, applications and publications to provide yet further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A calibration system operative to calibrate a voltage measurement device, wherein the voltage measurement device, in operation, generates a reference current signal and senses the reference current signal in a conductor under test via a voltage measurement device sensor, the calibration system comprising:
 a controllable calibration voltage source operative to selectively output a voltage in a calibration conductor; and
 control circuitry communicatively coupleable to the calibration voltage source and the voltage measurement device, wherein the control circuitry, in operation, for each calibration voltage of a plurality of calibration voltages:
  controls the calibration voltage source to output the calibration voltage in the calibration conductor;
  obtains a plurality of calibration points associated with the calibration voltage, each of the calibration points comprising:
   a reference current signal data point obtained from the voltage measurement device that is indicative of the reference current signal that is measured by the voltage measurement device via the voltage measurement device sensor when the calibration voltage source outputs the calibration voltage in the calibration conductor; and
   a calibration factor indicative of a ratio of the calibration voltage to a measured output voltage data point obtained from the voltage measurement device that is determined by the voltage measurement device based at least in part on the reference current signal data point;
  determines calibration data for the voltage measurement device based on the obtained plurality of calibration points, the calibration data dependent on the reference current signal measured by the voltage measurement device and the plurality of calibration voltages; and
  stores the calibration data on at least one nontransitory processor-readable storage medium associated with the voltage measurement device for use by the voltage measurement device during subsequent operation of the voltage measurement device.

2. The calibration system of claim 1 wherein the voltage measurement device is a non-contact measurement device, and for each of the plurality of calibration voltages, the calibration points comprises a range of reference current signal data points that are obtained by selectively adjusting a physical distance between the voltage measurement device sensor of the voltage measurement device and the calibration conductor.

3. The calibration system of claim 1 wherein the calibration data comprises a lookup table that, in operation, allows the voltage measurement device to determine a calibration factor for a particular reference current signal measurement and a particular output voltage measurement using bilinear interpolation.

4. The calibration system of claim 1 wherein the calibration data comprises coefficients for a plurality of mathematical formulas, wherein each of the plurality of mathematical formulas corresponds to a respective one of the calibration voltages.

5. The calibration system of claim 1 wherein, for each of the calibration voltages, the control circuitry determines the calibration data by fitting the plurality of calibration points to a curve defined by a mathematical formula.

6. The calibration system of claim 5 wherein, for each of the calibration voltages, the mathematical formula is $y=a/(x-b)^c+d$, where y is the calibration voltage, x is the reference current signal, and a, b, c, and d are coefficients determined by analysis of the plurality of calibration points associated with the respective calibration voltage.

7. The calibration system of claim 6 wherein the value of the coefficients a, b, and c for each one of the plurality of mathematical formulas are equal to the value of the coefficients a, b, and c, respectively, for each of the other ones of the plurality of mathematical formulas.

8. The calibration system of claim 1 wherein the plurality of calibration voltages comprises at least three calibration voltages.

9. The calibration system of claim 1 wherein the voltage measurement device comprises a sensor array comprising a first sensor portion and a second sensor portion, the first sensor portion interleaved with the second sensor portion, and each of the first and second sensor portions are selectively coupleable to a signal current amplifier and a reference current amplifier via controllable switches.

10. The calibration system of claim 1 wherein the voltage measurement device comprises a sensor array comprising a plurality of sensor elements, and each of the sensor elements is selectively coupleable to an input node of processing circuitry and to a conductive guard node.

11. A calibration system operative to calibrate a voltage measurement device, the voltage measurement device comprising a plurality of voltage measurement device sensors and, in operation, the voltage measurement device generates at least one reference current signal and senses the at least one reference current signal in a conductor under test via the plurality of voltage measurement device sensors, the calibration system comprising:
  a controllable calibration voltage source operative to selectively output a voltage in a calibration conductor; and
  control circuitry communicatively coupleable to the calibration voltage source and the voltage measurement device, wherein the control circuitry, in operation:
    controls the calibration voltage source to output a calibration voltage in the calibration conductor;
    obtains a plurality of calibration points associated with the calibration voltage, each of the calibration points comprising:
      a plurality of reference current signal data points obtained from the voltage measurement device that are indicative of the reference current signals that are measured by the voltage measurement device via the plurality of voltage measurement device sensors when the calibration voltage source outputs the calibration voltage in the calibration conductor; and
      a calibration factor indicative of a ratio of the calibration voltage to a measured output voltage data point obtained from the voltage measurement device that is determined by the voltage measurement device based at least in part on the plurality of reference current signal data points;
    determines calibration data for the voltage measurement device based on the obtained plurality of calibration points, the calibration data dependent on the reference current signals measured by the voltage measurement device via the plurality of voltage measurement device sensors; and
    stores the calibration data on at least one nontransitory processor-readable storage medium associated with the voltage measurement device for use by the voltage measurement device during subsequent operation of the voltage measurement device.

12. The calibration system of claim 11 wherein the voltage measurement device is a non-contact measurement device, and at least some of the calibration points are obtained by selectively adjusting a physical distance between the voltage measurement device and the calibration conductor.

13. The calibration system of claim 11 wherein the calibration data comprises a lookup table that, in operation, allows the voltage measurement device to determine a calibration factor for a particular plurality of reference current signal measurements using interpolation.

14. The calibration system of claim 11 wherein the calibration data comprises coefficients for at least one mathematical formula.

15. The calibration system of claim 11 wherein the control circuitry determines the calibration data by fitting the calibration points to a curve defined by a mathematical formula.

16. The calibration system of claim 11 wherein the plurality of reference current signal data points for each calibration point comprises at least three reference current signal data points.

17. A method of operating a calibration system to calibrate a voltage measurement device, wherein the voltage measurement device, in operation, generates a reference current signal and senses the reference current signal in a conductor under test via a voltage measurement device sensor, the method comprising:
  for each calibration voltage of a plurality of calibration voltages,
    controlling a calibration voltage source to output the calibration voltage in a calibration conductor;
    obtaining a plurality of calibration points associated with the calibration voltage, each of the calibration points comprising:
      a reference current signal data point obtained from the voltage measurement device that is indicative of the reference current signal that is measured by the voltage measurement device via the voltage measurement device sensor when the calibration voltage source outputs the calibration voltage in the calibration conductor; and
      a calibration factor indicative of a ratio of the calibration voltage to a measured output voltage data point obtained from the voltage measurement device that is determined by the voltage measurement device based at least in part on the reference current signal data point;
  determining calibration data for the voltage measurement device based on the obtained plurality of calibration points, the calibration data dependent on the reference current signal measured by the voltage measurement device and the plurality of calibration voltages; and
  storing the calibration data on at least one nontransitory processor-readable storage medium associated with the voltage measurement device for use by the voltage measurement device during subsequent operation of the voltage measurement device.

18. The method of claim 17 wherein determining calibration data comprises generating a lookup table that, in operation, allows the voltage measurement device to determine a calibration factor for a particular reference current signal measurement and a particular output voltage measurement using bilinear interpolation.

19. The method of claim 17 wherein determining calibration data comprises determining coefficients for a plurality of mathematical formulas, each of the plurality of mathematical formulas corresponding to a respective one of the calibration voltages.

20. The method of claim 17 wherein determining calibration data comprises, for each of the calibration voltages, fitting the calibration points to a curve defined by a mathematical formula.

21. The method of claim 17 wherein controlling the calibration voltage source to output a plurality of calibration voltages comprises controlling the calibration voltage source to output at least three calibration voltages.

22. The method of claim 17 wherein the voltage measurement device is a non-contact measurement device, and for each of the plurality of calibration voltages, obtaining a plurality of calibration points comprises selectively adjusting a physical distance between the voltage measurement device sensor of the voltage measurement device and the calibration conductor.

* * * * *